US011276632B2

(12) United States Patent
Jung et al.

(10) Patent No.: US 11,276,632 B2
(45) Date of Patent: Mar. 15, 2022

(54) SEMICONDUCTOR PACKAGE

(71) Applicant: NEPES CO., LTD., Chungcheongbuk-do (KR)

(72) Inventors: Gi Jo Jung, Cheongju-si (KR); Chang Yong Jo, Cheongju-si (KR); Young Mo Lee, Cheongju-si (KR); Jung Sic Oh, Cheongju-si (KR); Jong Ho Han, Cheongju-si (KR)

(73) Assignee: NEPES CO., LTD., Chungcheongbuk-Do (KR)

( * ) Notice: Subject to any disclaimer, the term of this patent is extended or adjusted under 35 U.S.C. 154(b) by 107 days.

(21) Appl. No.: 16/724,889

(22) Filed: Dec. 23, 2019

(65) Prior Publication Data

US 2020/0203265 A1 Jun. 25, 2020

(30) Foreign Application Priority Data

Dec. 24, 2018 (KR) .................. 10-2018-0168468
Apr. 2, 2019 (KR) .................. 10-2019-0038610
Apr. 2, 2019 (KR) .................. 10-2019-0038611
Apr. 18, 2019 (KR) .................. 10-2019-0045644
Jun. 11, 2019 (KR) .................. 10-2019-0068803

(51) Int. Cl.
*H01L 23/498* (2006.01)
*H01L 23/00* (2006.01)
*H01L 23/532* (2006.01)

(52) U.S. Cl.
CPC .. *H01L 23/49816* (2013.01); *H01L 23/49838* (2013.01); *H01L 23/49866* (2013.01); *H01L 23/53242* (2013.01); *H01L 24/14* (2013.01)

(58) Field of Classification Search
CPC ............................................... H01L 23/49816
See application file for complete search history.

(56) References Cited

U.S. PATENT DOCUMENTS

| 6,358,630 B1 | 3/2002 | Tsukada et al. |
| 6,548,898 B2 | 4/2003 | Matsuki et al. |
| 7,642,647 B2 | 1/2010 | Minda |
| 10,096,552 B2 | 10/2018 | Kim et al. |

(Continued)

FOREIGN PATENT DOCUMENTS

| CN | 106887420 A | 6/2017 |
| JP | H10-98044 A | 4/1998 |

(Continued)

OTHER PUBLICATIONS

Office Action issued on Korean Patent Application 10-2019-0038610 dated Jul. 1, 2020, 6 pages.

(Continued)

*Primary Examiner* — William A Harriston
(74) *Attorney, Agent, or Firm* — Crowell & Moring LLP

(57) ABSTRACT

A semiconductor package includes a semiconductor chip including a chip pad on a first surface thereof, an external pad electrically connected to the chip pad of the semiconductor chip, an external connection terminal covering the external pad, and an intermediate layer between the external pad and the external connection terminal, the intermediate layer including a third metal material that is different from a first metal material included in the external pad and a second metal material included in the external connection terminal.

17 Claims, 49 Drawing Sheets

(56) References Cited

U.S. PATENT DOCUMENTS

| | | |
|---|---|---|
| 2003/0127743 A1 | 7/2003 | Brintzinger |
| 2005/0258540 A1* | 11/2005 | Minda ............... H01L 24/03 257/738 |
| 2011/0193223 A1* | 8/2011 | Ozaki ............... H01L 25/50 257/737 |
| 2011/0254161 A1 | 10/2011 | Hu |
| 2012/0098124 A1 | 4/2012 | Wu et al. |
| 2012/0129335 A1 | 5/2012 | Ikumo et al. |
| 2015/0145125 A1 | 5/2015 | Faust et al. |
| 2017/0179058 A1 | 6/2017 | Lou |

FOREIGN PATENT DOCUMENTS

| | | |
|---|---|---|
| JP | H11-077371 | 3/1999 |
| JP | 2005-333007 A | 12/2005 |
| JP | 2007-059937 | 3/2007 |
| JP | 2008016514 A | 1/2008 |
| JP | 2011-165862 A | 8/2011 |
| JP | 2012114148 A | 6/2012 |
| JP | 2013-30498 | 2/2013 |
| KR | 10-2018-0080071 | 7/2018 |
| TW | 498518 A | 8/2002 |
| TW | 200540946 A | 12/2005 |
| TW | M397597 | 2/2011 |
| TW | 201133733 A | 10/2011 |
| TW | 201222752 A | 6/2012 |

OTHER PUBLICATIONS

Office Action issued on Korean Patent Application 10-2019-0045644 dated Aug. 1, 2020, 6 pages.
Office Action dated Mar. 8, 2021, for corresponding Taiwanese Patent Application No. 108147467 with English Translation.
Office Action issued on Korean Patent Application 10-2019-0038611 dated Apr. 21, 2020, 6 pages.
Office Action issued on Korean Patent Application 10-2019-0068803 dated Oct. 1, 2020, 9 pages.

* cited by examiner

SEMICONDUCTOR PACKAGE

CROSS-REFERENCE TO RELATED APPLICATIONS

This application claims priority to, and all benefits of, Korean Patent Applications No. 10-2018-0168468, filed on Dec. 24, 2018, No. 10-2019-0038610, filed on Apr. 2, 2019, No. 10-2019-0038611, filed on Apr. 2, 2019, No. 10-2019-0045644, filed on Apr. 18, 2019, and No. 10-2019-0068803, filed on Jun. 11, 2019 in the Korean Intellectual Property Office, the disclosures of which are incorporated herein in their entirety by reference.

BACKGROUND

1. Field

One or more embodiments relate to a semiconductor package, and more particularly, to a wafer level package.

2. Description of Related Art

In general, semiconductor packaging processes are performed on semiconductor chips that are manufactured by performing various semiconductor processes on a wafer to manufacture a semiconductor package. Recently, in order to reduce manufacturing cost of a semiconductor package, a wafer level packaging technique has been suggested, in which semiconductor packaging processes are performed at a wafer level and a semiconductor package of a wafer level that has undergone through the semiconductor packaging processes are singulated in units of single semiconductor package.

SUMMARY

One or more embodiments provide a semiconductor package and a method of manufacturing the semiconductor package.

Additional aspects will be set forth in part in the description which follows and, in part, will be apparent from the description, or may be learned by practice of the presented embodiments of the disclosure.

According to one or more embodiments, a semiconductor package includes a semiconductor chip including a chip pad on a first surface thereof, an external pad electrically connected to the chip pad of the semiconductor chip, an external connection terminal covering the external pad, and an intermediate layer between the external pad and the external connection terminal, the intermediate layer including a third metal material that is different from a first metal material included in the external pad and a second metal material included in the external connection terminal.

The third metal material in the intermediate layer may comprises noble metal including aurum (Au), and the intermediate layer is formed by an electro-less plating method.

The semiconductor package may further include an insulating layer on a first surface of the semiconductor chip, wherein the external connection terminal covers a side wall of the external pad and is in surface contact with an upper surface of the insulating layer.

With respect to a first direction that is in parallel with the first surface of the semiconductor chip, a thickness of the external connection terminal in the first direction, between an uppermost end of the side wall of the external pad and an external surface of the external connection terminal, may be about 10 μm to about 30 μm.

The semiconductor package may further include an insulating layer on a first surface of the semiconductor chip, wherein, with respect to a second direction that is perpendicular to the first surface of the semiconductor chip, a height of the external pad in the second direction based on an upper surface of the insulating layer may be about 10 μm to about 50 μm.

The semiconductor package may further include a wiring pattern extending between the chip pad of the semiconductor chip and the external pad, the wiring pattern electrically connecting the chip pad to the external pad.

The semiconductor package may be a fan-out type semiconductor package.

According to one or more embodiments, a semiconductor package includes a semiconductor chip including a chip pad on a first surface thereof, an external pad electrically connected to the chip pad of the semiconductor chip, and an external connection terminal covering the external pad, the external connection terminal comprising a solder, wherein the external connection terminal further includes a second metal material that is different from the solder and a first metal material included in the external pad.

The second metal material may be about 0.00001 wt % to about 1 wt % of a total weight of the external connection terminal.

The second metal material may include noble metal.

The external connection terminal may cover a side wall of the external pad, and with respect to a first direction that is in parallel with the first surface of the semiconductor chip, a thickness of the external connection terminal in the first direction, between an uppermost end of the side wall of the external pad and an external surface of the external connection terminal, may be about 10 μm to about 30 μm.

According to one or more embodiments, a semiconductor package includes a substrate including a conductive pad on a first surface thereof, an insulating pattern on the first surface, the insulating pattern at least partially exposing the conductive pad, a lower metal layer connected to the conductive pad, an upper metal layer on the lower metal layer, and an external connection terminal covering entire upper surface and entire side wall surface of the upper metal layer, wherein a lateral profile of the lower metal layer is located inside the side wall surface of the upper metal layer.

The lateral profile of the lower metal layer may include a concave curve, the upper metal layer may include a protrusion protruding in a lateral direction from the lower metal layer, and the external connection terminal may include an extension that extends towards a lower portion of the protrusion of the upper metal layer.

The external connection terminal may be in contact with a lower surface of the upper metal layer.

The extension may be in contact with the side surface of the lower metal layer.

The semiconductor package may further include an intermetallic compound between the external connection terminal and the upper metal layer.

The external connection terminal may be in contact with the side wall surface of the upper metal layer and an upper surface of the insulating pattern near the side wall surface.

The substrate may include a semiconductor substrate, and the conductive pad may include a chip pad electrically connected to the semiconductor substrate.

The lower metal layer may be electrically connected to the conductive pad via a wiring pattern, the wiring pattern may have a thickness of about 3 μm to about 8 μm, and a ratio of a sum (T2) of thicknesses of the upper metal layer and the lower metal layer with respect to the thickness (T1) of the wiring pattern, that is, T2/T1, may be about 1.25 to about 40.

The upper metal layer may have a thickness of about 10 μm to about 100 μm in a direction perpendicular to the first surface.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
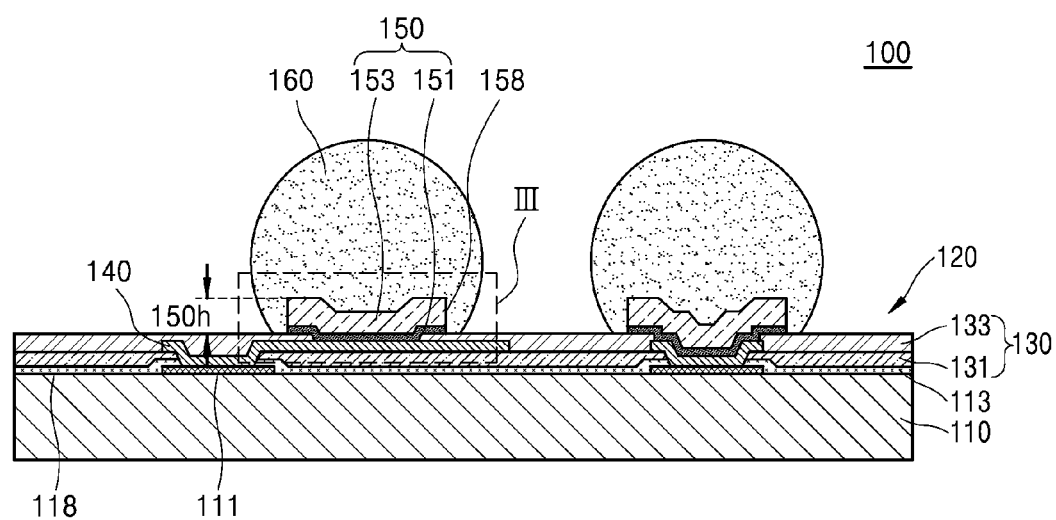
FIG. 1 is a cross-sectional view of a semiconductor package according to an embodiment.
Figure 1:
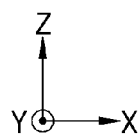

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first," "second," etc. may be used herein to describe various components, these components should not be limited by these terms. Terms are only used to distinguish one element from other elements. For example, a first component may be referred to as a second component and vice versa, without departing from the scope of the present disclosure.

The terms used in the present specification are merely used to describe particular embodiments, and are not intended to limit the present disclosure. An expression used in the singular encompasses the expression of the plural, unless it has a clearly different meaning in the context. In the present specification, it will be understood that the terms "comprises" or "comprising," when used in this specification, specify the presence of stated features, number, steps, operations, elements, components, and groups thereof, but do not preclude the presence or addition of one or more other features, number, steps, operations, elements, components, or groups thereof.

Unless otherwise defined, all terms used herein and including technical and scientific terms have the same meaning as those generally understood by one of ordinary skill in the art. Also, terms defined in commonly used dictionaries should be interpreted as having the same meanings as those in the context of related technologies, and unless clearly defined, are not interpreted as ideally or excessively formal meanings.

When a certain embodiment may be implemented differently, a specific process order may be performed differently from the described order. For example, two consecutively described processes may be performed substantially at the same time or performed in an order opposite to the described order.

In the drawings, for example, according to the manufacturing technology and/or tolerance, variations from the illustrated shape may be expected. Thus, the embodiments of the present disclosure must not be interpreted to be limited by a particular shape that is illustrated in the drawings and must include a change in the shape occurring, for example, during manufacturing. As used herein, "and/or" includes each and at least one all combinations of the mentioned items. Also, the term "substrate" used herein may denote the substrate itself, or a stack structure including a substrate and a predetermined layer or film formed on the substrate. Also, "surface of a substrate" used herein may denote an exposed surface of the substrate itself, or an outer surface of a predetermined layer or film formed on the substrate.

FIG. 1 is a cross-sectional view of a semiconductor package 100 according to an embodiment.

Referring to FIG. 1, the semiconductor package 100 may include a semiconductor chip 110 and a redistribution structure 120, an external pad 150, and an external connection terminal 160 on the semiconductor chip 110.

A plurality of individual devices of various kinds may be formed in the semiconductor chip 110. For example, the plurality of individual devices may include various microelectronic devices, for example, a metal-oxide-semiconductor field effect transistor (MOSFET) such as a complementary metal oxide semiconductor (CMOS), a system large scale integration (LSI), an image sensor such as a CMOS imaging sensor (CIS), a micro-electro-mechanical system (MEMS), an active device, a passive device, etc.

The semiconductor chip 110 may include a chip pad 111 on a first surface 118. The chip pad 111 may be electrically connected to the individual devices formed in the semiconductor chip 110. Also, the semiconductor chip 110 may include a passivation layer 113 covering the first surface 118.

In one or more embodiments, the semiconductor chip 110 may include, for example, a memory semiconductor chip. The memory semiconductor chip may include, for example, a volatile memory semiconductor chip such as dynamic random access memory (DRAM) or static RAM (SRAM), or a non-volatile memory semiconductor chip such as phase-change RAM (PRAM), magnetoresistive RAM (MRAM), ferroelectric RAM (FeRAM), or a resistive RAM (RRAM).

Alternatively, in one or more embodiments, the semiconductor chip 110 may include a logic chip. For example, the semiconductor chip 110 may include a central processor unit (CPU), a micro processor unit (MPU), a graphic processor unit (GPU), or an application processor (AP).

In addition, the semiconductor package 100 includes one semiconductor chip 110 in FIG. 1, but the semiconductor package 100 may include two or more semiconductor chips 110. Two or more semiconductor chips 110 included in the semiconductor package 100 may include semiconductor chips of the same kind or different kinds. In some embodiments, the semiconductor package 100 may include a system-in-package (SIP) in which semiconductor chips of different kinds are electrically connected to one another to operate as one system.

The redistribution structure 120 may be on the first surface 118 of the semiconductor chip 110. The redistribution structure 120 may include an insulating pattern 130 and a wiring pattern 140.

The insulating pattern 130 may be on the first surface 118 of the semiconductor chip 110. The insulating pattern 130 may have a structure in which a plurality of insulating layers are laminated. For example, the insulating pattern 130 may include a first insulating pattern 131 and a second insulating pattern 133 that are sequentially laminated on the first surface 118 of the semiconductor chip 110.

For example, each of the first insulating pattern 131 and the second insulating pattern 133 may include an insulating polymer, epoxy, a silicon oxide layer, a silicon nitride layer, or a combination thereof.

The wiring pattern 140 may be provided in the insulating pattern 230 for electrically connecting the chip pad 111 of the semiconductor chip 110 to the external pad 150. In more detail, a part of the wiring pattern 140 may be connected to the chip pad 111 of the semiconductor chip 110 via an opening in the first insulating pattern 131, and another part of the wiring pattern 140 may extend along a surface of the first insulating pattern 131. For example, the wiring pattern 140 may include tungsten (W), copper (Cu), zirconium (Zr), titanium (Ti), tantalum (Ta), aluminum (Al), ruthenium (Ru), palladium (Pd), platinum (Pt), cobalt (Co), nickel (Ni), or a combination thereof.

In FIG. 1, the wiring pattern 140 has a single-layered structure, but the wiring pattern 140 may include a multi-layered structure in which a plurality of wiring layers are vertically laminated.

The external pad 150 is on the second insulating pattern 133 and may function as a pad on which an external connection terminal 160 is placed. The external pad 150 may be connected to the wiring pattern 140 via the opening in the second insulating pattern 133 and may be electrically connected to the chip pad 111 of the semiconductor chip 110 via the wiring pattern 140. For example, the external pad 150 may include an under bump metal layer (UBM).

The external pad 150 may have a thickness greater than that of the wiring pattern 140. For example, as compared with the wiring pattern 140 having a thickness of about 3 µm to about 8 µm, the external pad 150 may have a thickness of 10 µm or greater.

With respect to a second direction (e.g., Z-direction) perpendicular to the first surface 118 of the semiconductor chip 110, a height 150h of the external pad 150 may denote a height of the external pad 150 in the second direction based on an upper surface of the second insulating pattern 133. In one or more embodiments, the height 150h of the external pad 150 may range from 10 µm to 50 µm. For example, the height 150h of the external pad 150 may be about 30 µm.

The external pad 150 may include a lower metal layer 151 and an upper metal layer 153 on the lower metal layer 151.

The lower metal layer 151 may be formed on the wiring pattern 140 that is exposed through the opening of the second insulating pattern 133 and may extend along a surface of the second insulating pattern 133. The lower metal layer 151 may act as, for example, a seed layer or an adhesive layer for forming the upper metal layer 153. For example, the lower metal layer 151 may include Ti, Cu, chrome (Cr), W, Ni, Al, Pd, aurum (Au), or a combination thereof.

In one or more embodiments, the lower metal layer 151 may include one metal layer, but may have a multi-layered structure including a plurality of metal layers. For example, the lower metal layer 151 may include a first sub-metal layer and a second sub-metal layer that are sequentially laminated on the second insulating pattern 133 and the wiring pattern 140. The first sub-metal layer may include a metal material having an excellent adhesive characteristic with respect to the second insulating pattern 133. For example, the first sub-metal layer may include Ti. The second sub-metal layer may function as a seed layer for forming the upper metal layer 153. For example, the second sub-metal layer may include Cu.

The upper metal layer 153 may be provided on the lower metal layer 151. The upper metal layer 153 may be formed by, for example, a plating method using the lower metal layer 151 as a seed. The upper metal layer 153 has a pillar shape on the insulating pattern 230 and may have a depressed center. In one or more embodiments, the upper metal layer 153 may include Cu or a Cu alloy, but is not limited thereto.

The external connection terminal 160 may be on the external pad 150. The external connection terminal 160 may be a chip-substrate connection terminal for mounting the semiconductor package 100 on an external substrate. In one or more embodiments, the external connection terminal 160 may have a spherical shape or a ball shape. For example, the external connection terminal 160 may include tin (Sn), argentum (Ag), indium (In), bismuth (Bi), antimony (Sb), copper (Cu), zinc (Zn), lead (Pb), and/or an alloy thereof.

In one or more embodiments, the external connection terminal 160 may cover the external pad 150. For example, the external connection terminal 160 may cover an upper surface and side walls 158 of the external pad 150. Also, the external connection terminal 160 may cover a surface of the second insulating pattern 133 near the external pad 150 and may be in surface contact with the upper surface of the second insulating pattern 133.

In one or more embodiments, with respect to a first direction (e.g., X-direction or Y-direction) that is in parallel with the first surface 118 of the semiconductor chip 110, a thickness of the external connection terminal 160 in the first direction on the side wall 158 of the external pad 150 may be 5 μm or greater. For example, on the side wall 158 of the external pad 150, the thickness of the external connection terminal 160 in the first direction may be at least 5 μm or greater. In one or more embodiments, the thickness of the external connection terminal 160 in the first direction between an uppermost end of the side wall 158 and an external surface of the external connection terminal 160 may be about 10 μm to about 30 μm. Also, in one or more embodiments, the thickness of the external connection terminal 160 in the first direction between a lowermost end of the side wall 158 and an external surface of the external connection terminal 160 may be about 5 μm to about 20 μm.

In one or more embodiments, the external connection terminal 160 completely covers the external pad 150 to prevent the external pad 150 from being exposed to outside and to prevent damage to the external pad 150 caused by the exposure of the external pad 150 to outside. Thus, the reliability of the semiconductor package 100 may be improved.

The semiconductor package 100 may have a fan-in structure. Alternatively, the semiconductor package 100 may have a fan-out structure. When the semiconductor package 100 has the fan-out structure, the wiring pattern 140 may further extend to outside the semiconductor chip 110, and at least one external pad 150 and at least one external connection terminal 160 may be on an outer portion of the semiconductor chip 110.

Figure 2:
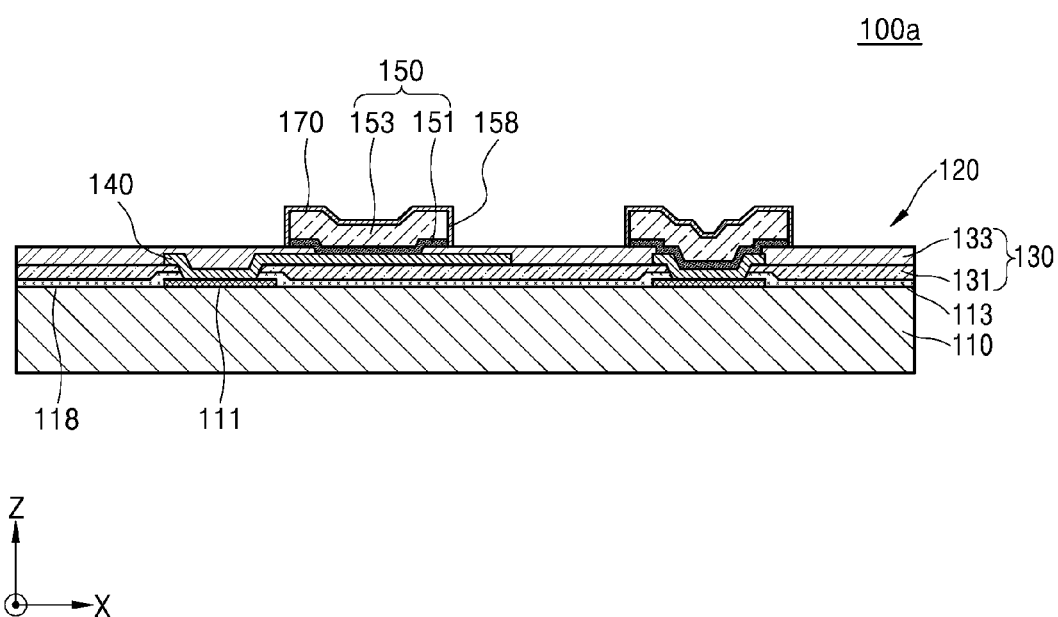
FIG. 2 is a cross-sectional view of a semiconductor package according to an embodiment.

FIG. 2 is a cross-sectional view of a semiconductor package 100a according to an embodiment. The semiconductor package 100a of FIG. 2 may have the same structure as that of the semiconductor package 100 shown in FIG. 1, except that the semiconductor package 100a further includes a cover layer 170 and the external connection terminal 160 (see FIG. 1) is omitted. In FIG. 2, descriptions about the elements that are already described above with reference to FIG. 1 are briefly provided or omitted.

Referring to FIG. 2, the semiconductor package 100a may include the cover layer 170 that covers the external pad 150. For example, the cover layer 170 is formed by an electroless plating method or a sputtering method so as to at least partially cover the surface of the external pad 150.

In one or more embodiments, the cover layer 170 may entirely cover the surface of the external pad 150. That is, the cover layer 170 may cover the upper surface and the side walls 158 of the external pad 150. Alternatively, in one or more embodiments, the cover layer 170 may partially cover the surface of the external pad 150. For example, the cover layer 170 may be only on the side walls 158 of the external pad 150.

The cover layer 170 may improve flowability of a material included in the external connection terminal 160 when the external connection terminal 160 (see FIG. 1) is further formed on the external pad 150. For example, during a reflow process for forming the external connection terminal 160, a solder in a melted state may spread along the surface of the cover layer 170 that includes a metal material having an excellent wettability, and thus the external connection terminal 160 may cover the side wall 158 of the external pad 150 thick.

In one or more embodiments, the cover layer 170 may include a metal material having an excellent wettability. For example, the cover layer 170 may include noble metal such as Au, Ag, Pt, or Pd. For example, the cover layer 170 may include Au, Pd, Ni, Cu, a solder, or a combination thereof.

In one or more other embodiments, a conductive wire may be attached to the cover layer 170. The conductive wire may extend between an external substrate and the cover layer 170 to electrically connect the external substrate to the cover layer 170.

The cover layer 170 may include a metal layer formed thin on the surface of the external pad 150. In one or more embodiments, a thickness of the cover layer 170 may be about 0.001 μm or greater, 0.005 μm or greater, 0.01 μm or greater, 0.05 μm or greater, or 0.1 μm or greater. When the thickness of the cover layer 170 is less than 0.001 μm, the wettability of the cover layer 170 degrades, and thus, the flowability of the material in the external connection terminal 160 may not be sufficiently increased during the reflow process of the external connection terminal 160 (see FIG. 1) by using the cover layer 170. Consequently, the side walls of the external pad 150 may not be covered by the external connection terminal 160 or the thickness of the external connection terminal 160 on the side wall of the external pad 150 may be reduced.

Also, in one or more embodiments, the thickness of the cover layer 170 may be about 1 μm or less, 0.95 μm or less, 0.9 μm or less, 0.85 μm or less, or 0.8 μm or less. When the thickness of the cover layer 170 is greater than 1 μm, the flowability of the material in the external connection terminal 160 is excessively increased during the reflow process of the external connection terminal 160 by using the cover layer 170, and thereby the height of the external connection terminal 160 may be excessively reduced. In addition, an intermetallic compound may be increased between the external connection terminal 160 and the external pad 150.

Figure 3:
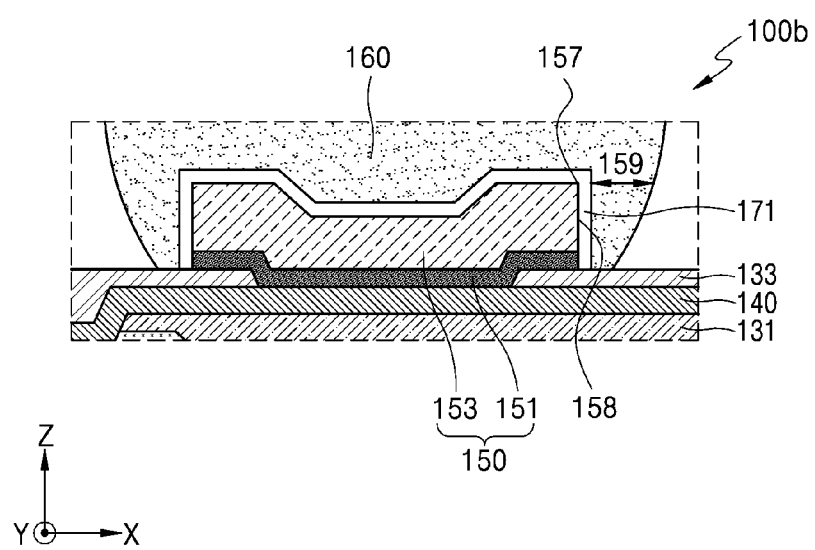
FIG. 3 is a cross-sectional view partially showing a semiconductor package according to an embodiment, that is, a region corresponding to a region III of FIG. 1.

FIG. 3 is a cross-sectional view partially showing a semiconductor package 100b according to an embodiment, that is, a region corresponding to a region III of FIG. 1. The semiconductor package 100b of FIG. 3 may have the same structure as that of the semiconductor package 100 of FIG. 1, except that an intermediate layer 171 is included in the semiconductor package 100b. In FIG. 3, descriptions about the elements that are already described above are briefly provided or omitted.

Referring to FIG. 3 with FIG. 1, the semiconductor package 100b may include the intermediate layer 171 between the external pad 150 and the external connection terminal 160. The intermediate layer 171 may include an intermetallic compound that is generated by a reaction between the metal material in the external pad 150 and the metal material in the external connection terminal 160 at a relatively high temperature. The intermetallic compound may be formed along the surface of the external pad 150.

In one or more embodiments, the intermediate layer 171 may further include a third metal material, in addition to a first metal material in the external pad 150 and a second metal material in the external connection terminal 160, wherein the third metal material is different from the first and second metal materials. In one or more embodiments, the third metal material in the intermediate layer 171 may have an excellent wettability. For example, the third metal material in the intermediate layer 171 may have a contact angle between 0° to 90°, between 10° to 80°, or between 20° to 70°, wherein the contact angle is a factor representing the wettability with respect to the external connection terminal 160. For example, the third metal material of the intermediate layer 171 may include noble metal such as Au, Ag, Pt, or Pd. For example, the third metal material of the intermediate layer 171 may include Au, Pd, Ni, Cu, a solder, or a combination thereof.

For example, the intermediate layer 171 may be formed by performing a reflow process in a state in which a solder ball is located on the cover layer 170 (see FIG. 2). In more detail, during the reflow process, the third metal material included in the cover layer 170 that is formed thin is diffused and the third metal material of the cover layer 170 reacts with the first metal material in the external pad 150 and the second metal material in the external connection terminal 160 at a high temperature, and accordingly, the intermediate layer 171 may be formed between the external pad 150 and the external connection terminal 160. For example, when the external pad 150 may include Cu and/or Ni, the external connection terminal 160 may include Sn and/or Cu, and the cover layer 170 includes Au, the intermediate layer 171 may include Cu—Ni—Sn—Au. However, the material or the composition of the intermediate layer 171 is not limited to the above example, that is, the material or the composition of the intermediate layer 171 may vary depending on the material in the external pad 150, the material in the external connection terminal 160, the material in the cover layer 170, a temperature and a time for performing the reflow process, etc.

In one or more embodiments, during the reflow process for forming the external connection terminal 160, the third metal material in the cover layer 170 is diffused, and thus, the external connection terminal 160 may include the third metal material. In one or more embodiments, content of the third metal material included in the external connection terminal 160 may be about 0.00001 wt % or greater, 0.00005 wt % or greater, 0.0001 wt % or greater, 0.0003 wt % or greater, or 0.0005 wt % or greater of a total weight of the external connection terminal 160. When the content of the third metal material in the external connection terminal 160 is less than 0.00001 wt % of the total weight of the external connection terminal 160, the wettability of the cover layer 160 is reduced, and thus, the flowability of the material in the external connection terminal 160 may not be sufficiently increased during the reflow process of the external connection terminal 160 (see FIG. 1) by using the cover layer 170. As a result, the side wall of the external pad 150 may not be covered by the external connection terminal 160 or the thickness of the external connection terminal 160 on the side wall of the external pad 150 may be greatly reduced.

Also, in one or more embodiments, the content of the third metal material included in the external connection terminal 160 may be about 1 wt % or less, 0.95 wt % or less, 0.85 wt % or less, or 0.8 wt % or less with respect to the total weight of the external connection terminal 160. When the content of the third metal material included in the external connection terminal 160 is greater than 1 wt % of the total weight of the external connection terminal 160, the flowability of the material in the external connection terminal 160 is excessively increased during the reflow process of the external connection terminal 160 by using the cover layer 170, and thus, the height of the external connection terminal 160 may be greatly reduced and the intermetallic compound may be formed thick between the external connection terminal 160 and the external pad 150.

In a general semiconductor package, the intermetallic compound formed at an interface between the external pad and the external connection terminal may be exposed to outside, or the external connection terminal covering the intermetallic compound on the side wall of the external pad may be formed thin. Since the intermetallic compound is brittle due to the external shock, cracks frequently occur around edges of an upper surface of the external pad due to the external shock, and accordingly, reliability in bonding between the semiconductor package and the external device degrades.

However, according to one or more embodiments, since the reflow process is performed in a state in which the cover layer 170 having an excellent wettability is formed, the external connection terminal 160 covering the intermetallic compound on the side wall 158 of the external pad 150 may be relatively thick. For example, with respect to the first direction (e.g., X-direction or Y-direction) that is in parallel with the first surface 118 of the semiconductor chip 110, a first thickness 159 of the external connection terminal 160 in the first direction may be about at least 10 μm or greater between the uppermost end 157 of the side wall 158 of the external pad 150 and the external surface of the external connection terminal 160. For example, the first thickness 159 of the external connection terminal 160 may be about 10 μm to about 30 μm. Here, the first thickness 159 of the external connection terminal 160 may be a value obtained by subtracting a thickness of the intermediate layer 171 on the side wall 158 of the external pad 150 in the first direction from the distance in the first direction between the uppermost end 157 of the side wall 158 of the external pad 150 and the external surface of the external connection terminal 160. Therefore, according to one or more embodiments, since the external shock may be buffered by the external connection terminal 160 that covers the side wall 158 of the external pad 150, occurrence of cracks around the external pad 150 may be restrained, and accordingly, the reliability in bonding between the semiconductor package 100b and the external device may be improved.

FIGS. 4A to 4H are cross-sectional views illustrating a method of manufacturing the semiconductor package 100, according to an embodiment, in a processing order. Hereinafter, the method of manufacturing the semiconductor package 100 of FIG. 1 will be described below with reference to FIGS. 4A to 4H.

Figure 4A:
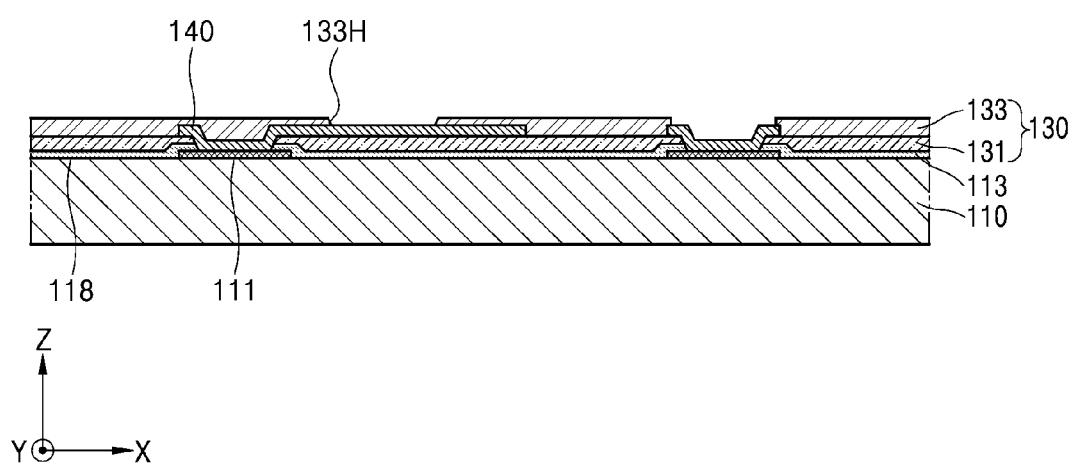
FIGS. 4A to 4H are cross-sectional views illustrating a method of manufacturing a semiconductor package, according to an embodiment, in a processing order.

Referring to FIG. 4A, the first insulating pattern 131 is formed on the first surface 118 of the semiconductor chip 110. For example, for forming the first insulating pattern 131, a first insulating layer covering the first surface 118 of the semiconductor chip 110 may be formed, and then, the first insulating layer may be partially removed to expose the chip pad 111 of the semiconductor chip 110.

After forming the first insulating pattern 131, the wiring pattern 140 is formed on the first insulating pattern 131. The wiring pattern 140 may be formed on the first insulating pattern 131 and the chip pad 111 of the semiconductor chip 110, which is exposed through the first insulating pattern 131. For example, the wiring pattern 140 may be formed through a seed layer forming process, a mask process, and a plating process.

After forming the wiring pattern 140, the second insulating pattern 133 is formed on the first insulating pattern 131. The second insulating pattern 133 may include an opening 133H for partially exposing the wiring pattern 140. For example, a second insulating layer covering the first insulating pattern 131 and the wiring pattern 140 may be formed in order to form the second insulating pattern 133, and then the second insulating layer may be partially removed to form the opening 133H that partially exposes the wiring pattern 140.

Figure 4B:
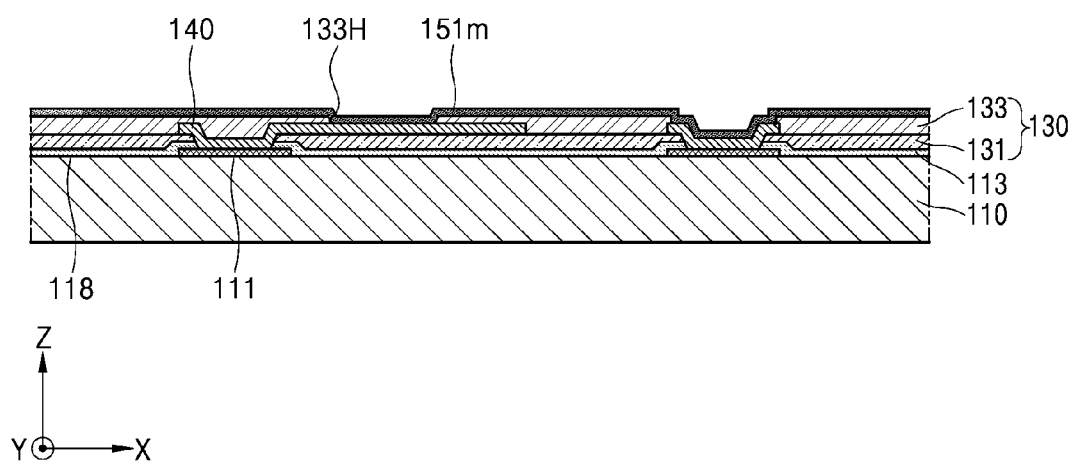

Referring to FIG. 4B, a lower metal layer 151m covering the second insulating pattern 133 and the wiring pattern 140 that is exposed through the opening 133H of the second insulating pattern 133 is formed. The lower metal layer 151m may be formed by, for example, a sputtering process. The lower metal layer 151m may include, for example, Ti, Cu, Cr, W, Ni, Al, Pd, Au, or a combination thereof.

Figure 4C:
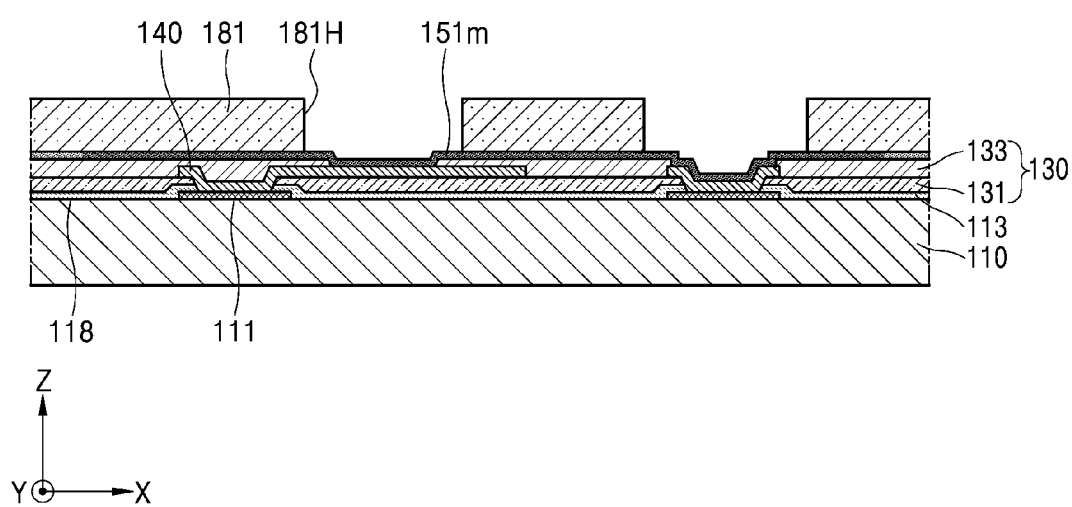

Referring to FIG. 4C, after forming the lower metal layer 151m, a first mask pattern 181 is formed on the lower metal layer 151m. The first mask pattern 181 may include an opening 181H that partially exposes the lower metal layer 151m. For example, the first mask pattern 181 may be formed by forming a photosensitive material layer on the lower metal layer 151m and patterning the photosensitive material layer by an exposure process and a development process performed on the photosensitive material layer.

Figure 4D:
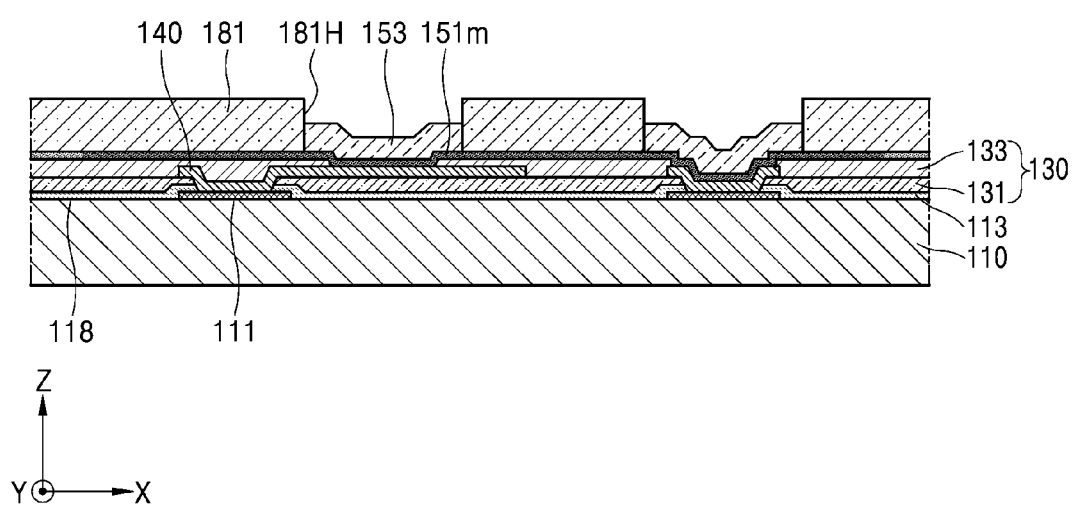

Referring to FIG. 4D, after forming the first mask pattern 181, the upper metal layer 153 is formed in the opening 181H of the first mask pattern 181. The upper metal layer 153 may be formed by a plating process in which the lower metal layer 151m is used as a seed.

Figure 4E:
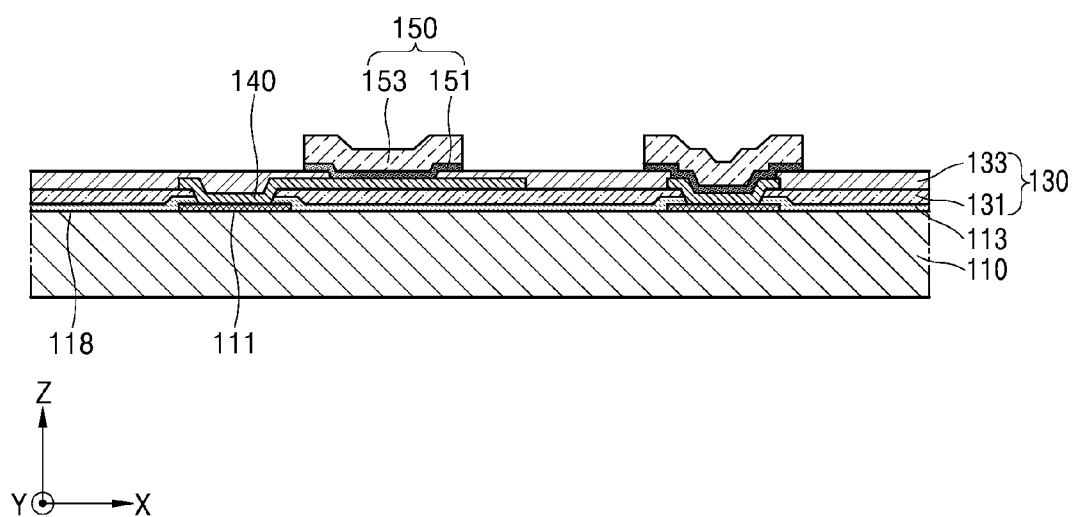

Referring to FIG. 4E, after forming the upper metal layer 153, the first mask pattern 181 (see FIG. 4D) is removed, and the lower metal layer 151m (see FIG. 4D) under the first mask pattern 181 is partially removed. For example, the first mask pattern 181 may be removed by a strip process and the lower metal layer 151m may be partially removed by an etching process. The upper metal layer 153 and the lower metal layer 151 under the upper metal layer 153 may configure the external pad 150.

Figure 4F:
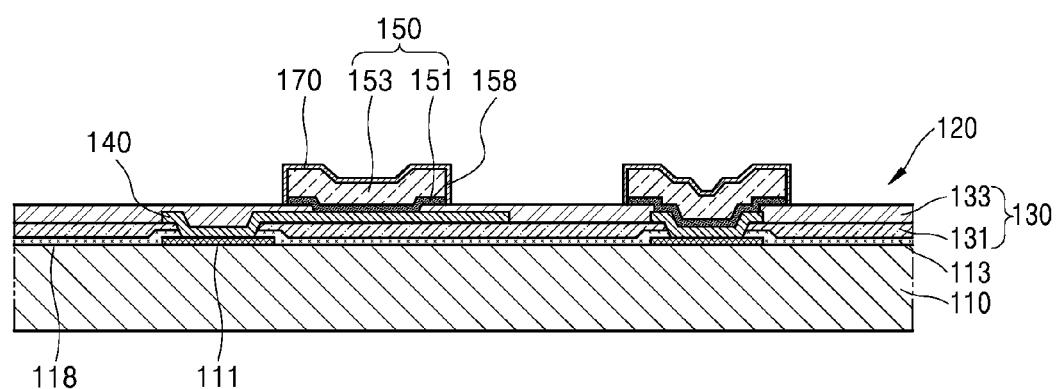

Referring to FIG. 4F, the cover layer 170 is formed on the external pad 150. The cover layer 170 may be formed to at least partially cover the external pad 150. For example, in order to form the cover layer 170, an electro-less plating process or a sputtering process is performed to form a metal layer on the external pad 150, wherein the metal layer includes a metal material having an excellent wettability. The metal layer may be formed thin, for example, to have a thickness of about 0.001 μm to about 1 μm, or about 0.01 μm to about 0.9 μm. For example, the cover layer 170 may include a metal material having an excellent wettability, for example, Au, Pd, Ni, Cu, a solder, or a combination thereof.

Figure 4G:
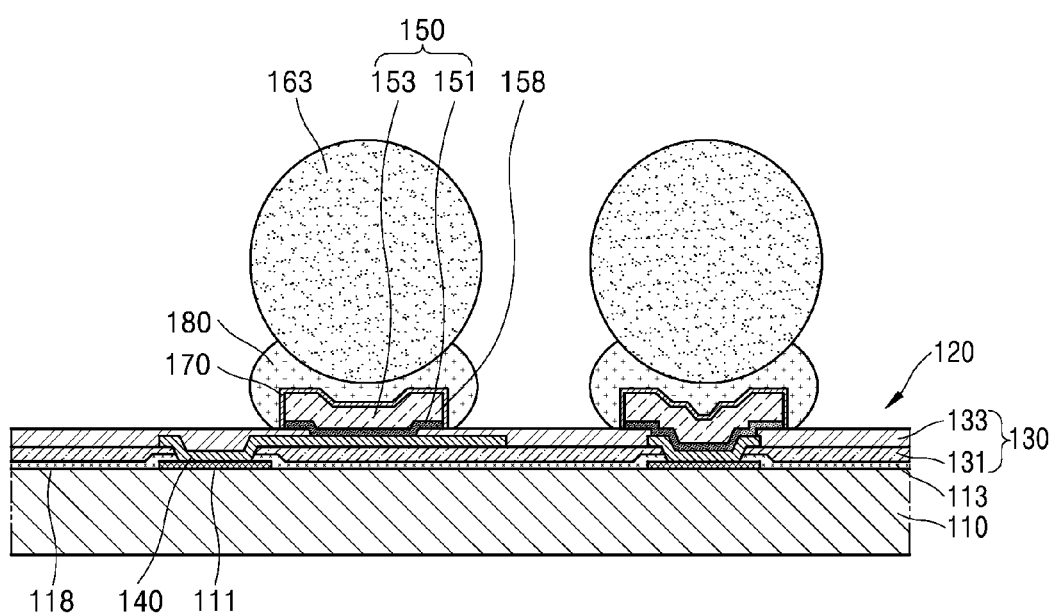

Referring to FIG. 4G, a flux 180 is applied onto the cover layer 170 and a solder ball 163 is placed on the cover layer 170, to which the flux 180 is applied. The solder ball 163 may have a spherical shape or a ball shape.

Figure 4H:
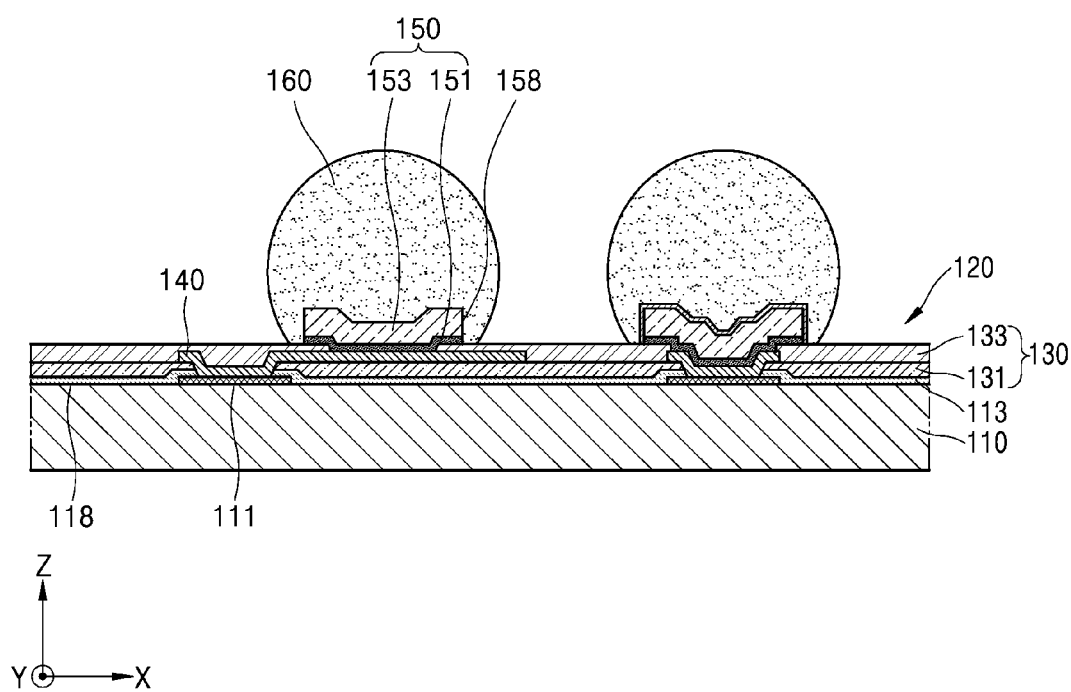

Referring to FIG. 4H, after arranging the solder ball 163 (see FIG. 4G) on the cover layer 170 (see FIG. 4G), the external connection terminal 160 may be formed by performing a reflow process. The reflow process may be performed at a high temperature, e.g., a temperature of about 200° C. to about 280° C., for tens of seconds to a few minutes. During the reflow process, the cover layer 170 may be diffused, and the third metal material included in the cover layer 170 reacts with the first metal material in the external pad 150 and the second metal material in the external connection terminal 160 at the high temperature, resulting in generation of an intermetallic compound.

After that, the semiconductor package manufactured at a wafer level is cut along a scribe lane to singulate the semiconductor package into semiconductor packages of individual unit.

When the external pad 150 is formed to have a height of 10 μm or greater (see 150h of FIG. 1), the side wall of the external pad may be exposed to outside or the external connection terminal covering the side wall of the external pad may not be formed to have a sufficient thickness after the reflow process in the semiconductor package. However, according to one or more embodiments, since the reflow process is performed in a state in which the cover layer 170 (see FIG. 4G) is formed on the external pad 150, the solder of a melted state may spread along the surface of the cover layer 170 including the metal material having excellent wettability, and the external connection terminal 160 formed as a result of the reflow process may thickly cover the side wall 158 of the external pad 150. Since the external shock may be buffered by the external connection terminal 160 that covers the side wall 158 of the external pad 150, occurrence of cracks around the external pad 150 may be restrained, and accordingly, the reliability in bonding between the semiconductor package and the external device may be improved.

Figure 5:
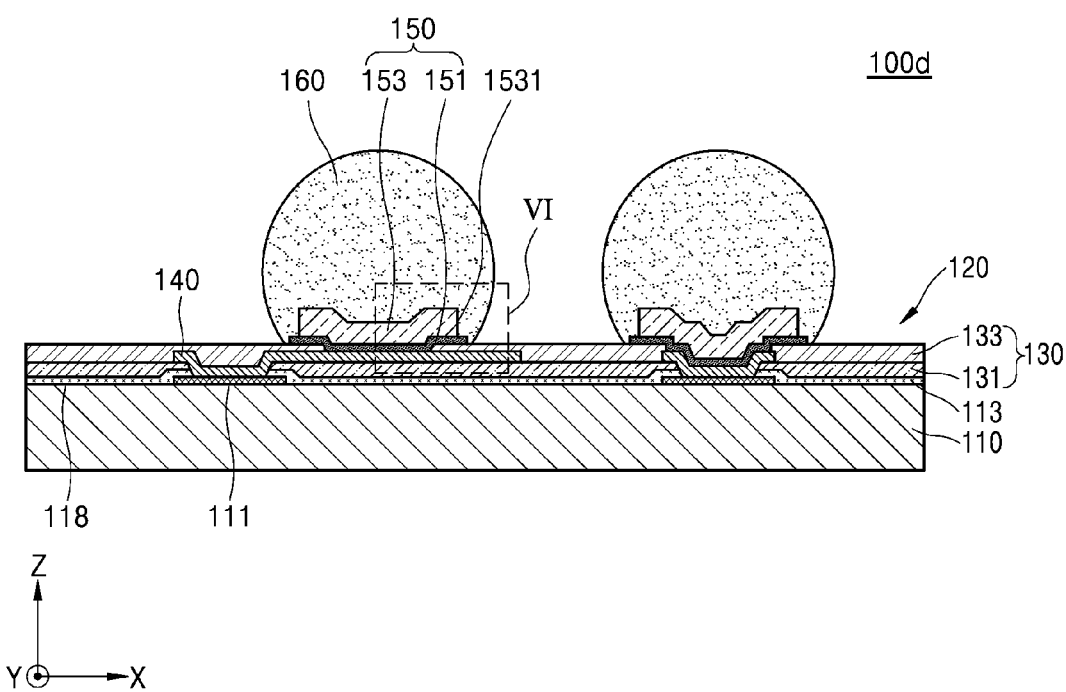
FIG. 5 is a cross-sectional view of a semiconductor package according to an embodiment.
Figure 6:
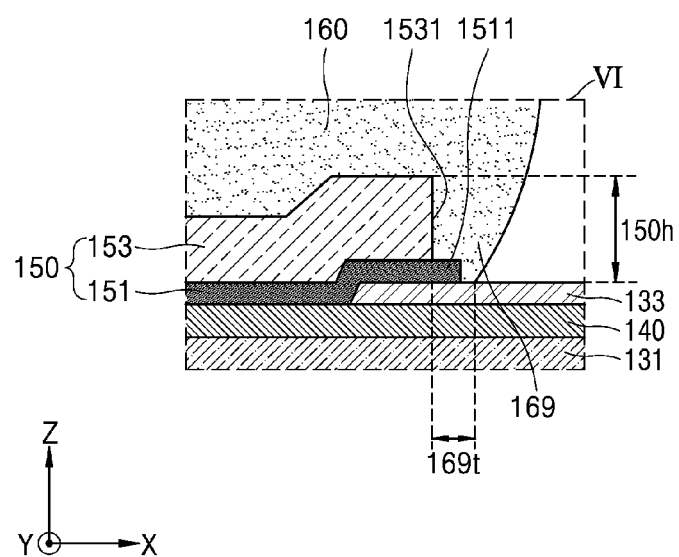
FIG. 6 is a cross-sectional view showing an enlarged view of a region VI of FIG. 5.

FIG. 5 is a cross-sectional view of a semiconductor package 100d according to an embodiment. FIG. 6 is a cross-sectional view showing an enlarged view of a region VI of FIG. 5.

Referring to FIGS. 5 and 6, the semiconductor package 100d may include the semiconductor chip 110, and the redistribution structure 120 and the external connection terminal 160 on the semiconductor chip 110. The redistribution structure 120 may be on the first surface 118 of the semiconductor chip 110. The redistribution structure 120 may include the insulating pattern 130, the wiring pattern 140, and the external pad 150.

The external pad 150 may include the lower metal layer 151 and the upper metal layer 153 on the lower metal layer 151.

The lower metal layer 151 may be formed on the wiring pattern 140 that is exposed through an opening of the second insulating pattern 133 and may extend along a surface of the second insulating pattern 133. The lower metal layer 151 may act as, for example, a seed layer or an adhesive layer for forming the upper metal layer 153. For example, the lower metal layer 151 may include Ti, Cu, Cr, W, Ni, Al, Pd, Au, or a combination thereof.

In one or more embodiments, the lower metal layer 151 may include one metal layer, but may have a multi-layered structure including a plurality of metal layers. For example, the lower metal layer 151 may include a first sub-metal layer and a second sub-metal layer that are sequentially laminated on the second insulating pattern 133 and the wiring pattern 140. The first sub-metal layer may include a metal material having an excellent adhesive characteristic with respect to the second insulating pattern 133. For example, the first sub-metal layer may include Ti. The second sub-metal layer may act as a seed layer for forming the upper metal layer 153. For example, the second sub-metal layer may include Cu.

In one or more embodiments, the lower metal layer 151 may include a protrusion 151l protruding from a side wall 153l of the upper metal layer 153. The protrusion 151l of the lower metal layer 151 may extend along the surface of the second insulating pattern 133. With respect to the first direction (e.g., X-direction or Y-direction) in parallel with the first surface 118 of the semiconductor chip 110, a protruding length of the protrusion 151l of the lower metal layer 151 from the side wall 153l of the upper metal layer 153 in the first direction may be about 5 μm to about 50 μm. Alternatively, in one or more embodiments, the protruding length of the protrusion 151l of the lower metal layer 151 from the side wall 153l of the upper metal layer 153 in the first direction may be about 5 μm to about 50 μm, or about 10 μm to about 30 μm.

The upper metal layer 153 may be provided on the lower metal layer 151. The upper metal layer 153 may be formed, for example, by a plating method using the lower metal layer 151 as a seed. The upper metal layer 153 has a pillar shape on the insulating pattern 130 and may have a depressed center. The upper metal layer 153 may have the side wall 1531 that is perpendicular to the first surface 118 of the semiconductor chip 110. In one or more embodiments, the upper metal layer 153 may include Cu or a Cu alloy, but is not limited thereto.

The external connection terminal 160 may be on the external pad 150. The external connection terminal 160 may be a chip-substrate connection terminal for mounting the semiconductor package 100d on an external substrate. In one or more embodiments, the external connection terminal 160 may have a spherical shape or a ball shape. For example, the external connection terminal 160 may include Sn, Ag, In, Bi, Sb, Cu, Zn, Pb, and/or an alloy thereof.

In one or more embodiments, the external connection terminal 160 may cover the external pad 150. For example, the external connection terminal 160 may cover an upper surface and the side wall 1531 of the upper metal layer 153. Also, the external connection terminal 160 may cover a surface of the second insulating pattern 133 near the external pad 150. The external connection terminal 160 may be in surface contact with the surface of the second insulating pattern 133.

In one or more embodiments, with respect to the first direction (e.g., X-direction or Y-direction) in parallel with the first surface 118 of the semiconductor chip 110, when a part of the external connection terminal 160 overlapping the side wall 1531 of the upper metal layer 153 in the first direction is defined as a first portion 169 of the external connection terminal 160, a minimum thickness 169t of the first portion 169 of the external connection terminal 160 in the first direction based on the side wall 1531 of the upper metal layer 153 may range from 5 μm to 50 μm, or from 10 μm to 30 μm.

In other words, the minimum distance between the side wall 1531 of the upper metal layer 153 and an outer circumferential surface of the first portion 169 in the external connection terminal 160 in the first direction may be 5 μm to 50 μm, or 10 μm to 30 μm.

In one or more embodiments, the external connection terminal 160 completely covers the external pad 150 to prevent the external pad 150 from being exposed to outside and to prevent damage to the external pad 150 caused by the exposure of the external pad 150 to outside. Thus, the reliability of the semiconductor package 100 may be improved.

FIGS. 7A to 7F are cross-sectional views illustrating a method of manufacturing a semiconductor package, according to an embodiment, in a processing order.

Figure 7A:
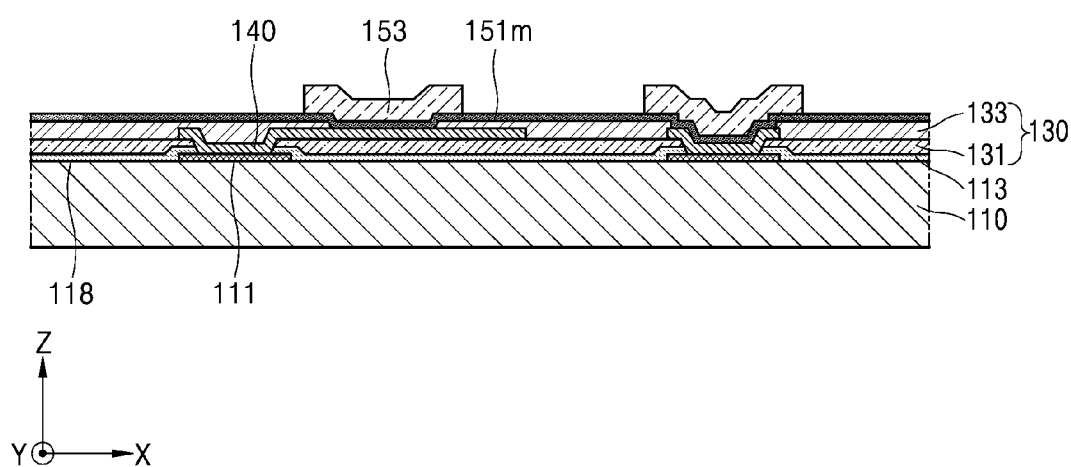
FIGS. 7A to 7F are cross-sectional views illustrating a method of manufacturing a semiconductor package, according to an embodiment, in a processing order.

Referring to FIG. 7A, a resultant from the process of FIG. 4D is prepared, and the first mask pattern 181 (see FIG. 4D) is removed. The first mask pattern 181 may be removed by, for example, a strip process.

Figure 7B:
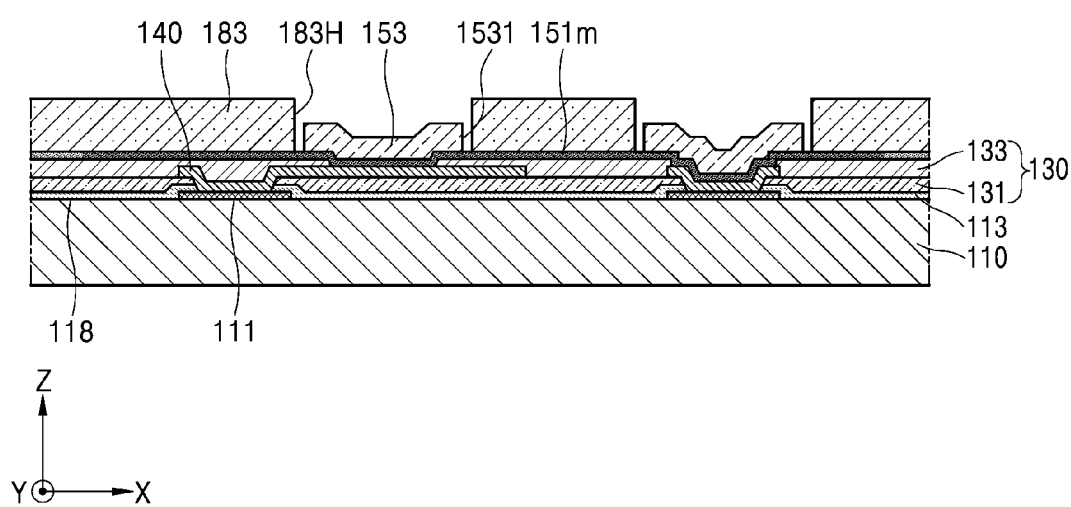

Referring to FIG. 7B, after removing the first mask pattern 181 (see FIG. 4D), a second mask pattern 183 is formed on the lower metal layer 151m. The second mask pattern 183 may include the opening 183H for exposing the upper metal layer 153. For example, the second mask pattern 183 may be obtained by forming a photosensitive material layer on the lower metal layer 151m and patterning the photosensitive material layer by an exposure process and a development process performed on the photosensitive material layer.

In one or more embodiments, the opening 183H of the second mask pattern 183 may have a width that is greater than that of the upper metal layer 153. The upper surface and the side wall 1531 of the upper metal layer 153 may be exposed through the opening 183H of the second mask pattern 183, and the lower metal layer 151m may be partially exposed between the side wall 1531 of the upper metal layer 153 and an internal wall of the second mask pattern 183.

The internal wall of the second mask pattern 183, which is formed by the opening 183H of the second mask pattern 183, may be spaced apart a predetermined distance from the side wall 1531 of the upper metal layer 153. In one or more embodiments, a distance between the side wall 1531 of the upper metal layer 153 and the internal wall of the second mask pattern 183 in the first direction (e.g., X-direction or Y-direction) that is in parallel with the first surface 118 of the semiconductor chip 110 may be 5 μm to 50 μm, or 10 μm to 30 μm.

Figure 7C:
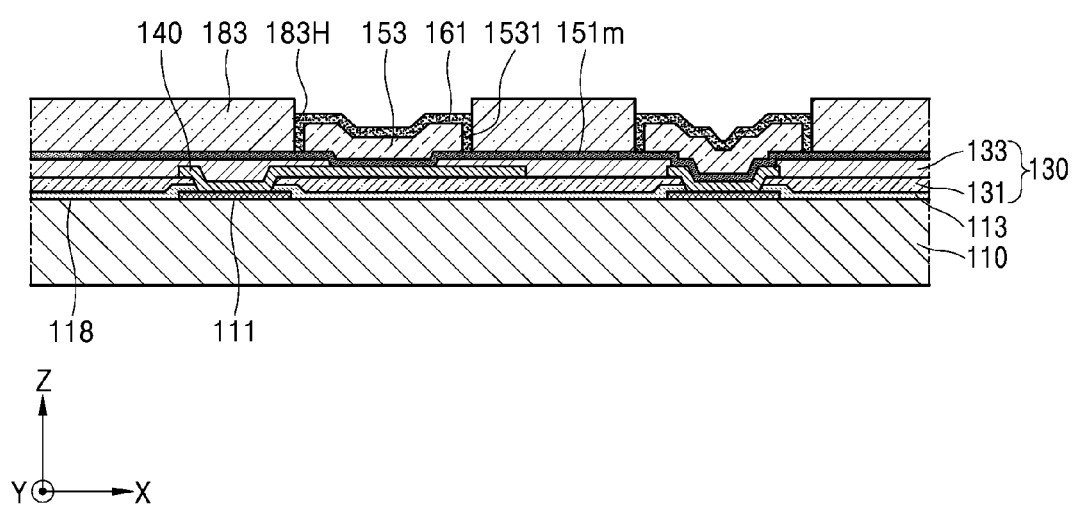

Referring to FIG. 7C, after forming the second mask pattern 183, a preliminary metal layer 161 covering the external pad 150 is formed in the opening 183H of the second mask pattern 183. For example, the preliminary metal layer 161 may cover the upper surface of the upper metal layer 153, the side wall 1531 of the upper metal layer 153, and the lower metal layer 151m exposed between the side wall 1531 of the upper metal layer 153 and the internal wall of the second mask pattern 183. For example, the preliminary metal layer 161 may be formed by a plating process.

For example, the preliminary metal layer 161 may include Sn, Ag, In, Bi, Sb, Cu, Zn, Pb, and/or an alloy thereof. In one or more embodiments, the preliminary metal layer 161 may include the same material as that of the solder ball 163 (see FIG. 7E) that is to be placed on the preliminary metal layer 161 through a post-process.

In one or more embodiments, the preliminary metal layer 161 may fill a space between the side wall 1531 of the upper metal layer 153 and the internal wall of the second mask pattern 183. Accordingly, a thickness of the preliminary metal layer 161 in the first direction (e.g., X-direction or Y-direction), wherein the preliminary metal layer 161 covers the side wall 1531 of the upper metal layer 153, may correspond to the separated distance between the side wall 1531 of the upper metal layer 153 and the internal wall of the second mask pattern 183. For example, the thickness of the preliminary metal layer 161 covering the side wall 1531 of the upper metal layer 153 in the first direction may be 5 μm to 50 μm or 10 μm to 30 μm.

Figure 7D:
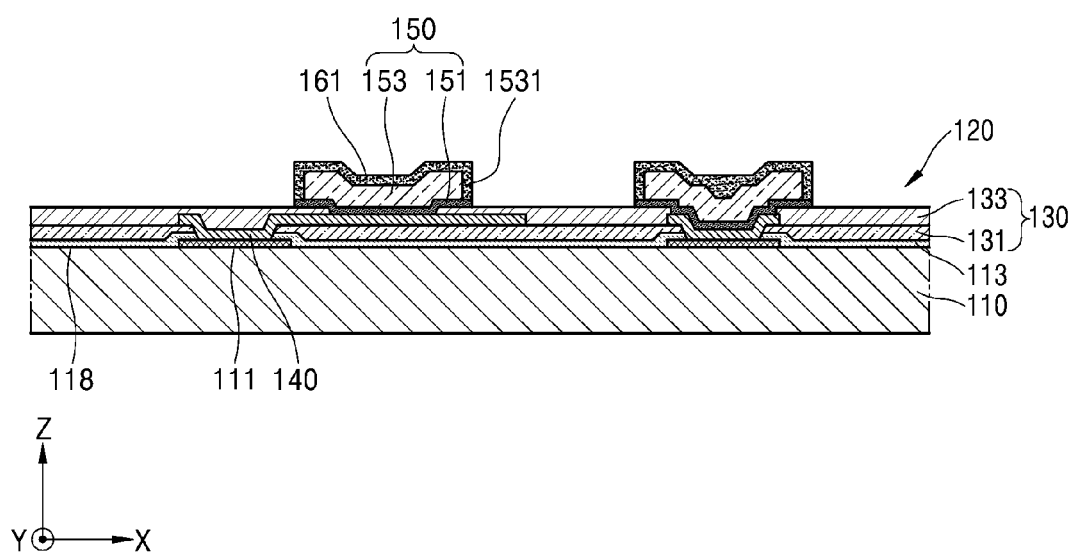

Referring to FIG. 7D, after forming the preliminary metal layer 161, the second mask pattern 183 (see FIG. 7C) is removed. The second mask pattern 183 may be removed by, for example, a strip process.

After removing the second mask pattern 183 (see FIG. 7C), the lower metal layer 151m (see FIG. 7C) that is exposed due to the removal of the second mask pattern 183 is partially removed. That is, a first portion of the lower metal layer 151m (see FIG. 7C), wherein the first portion is covered by the preliminary metal layer 161 and the upper metal layer 153, remains, and a second portion of the lower metal layer 151m, which is exposed due to the removal of the second mask pattern 183, may be removed. For example, the second portion of the lower metal layer 151m (see FIG. 7C) may be removed by an etching process.

Figure 7E:
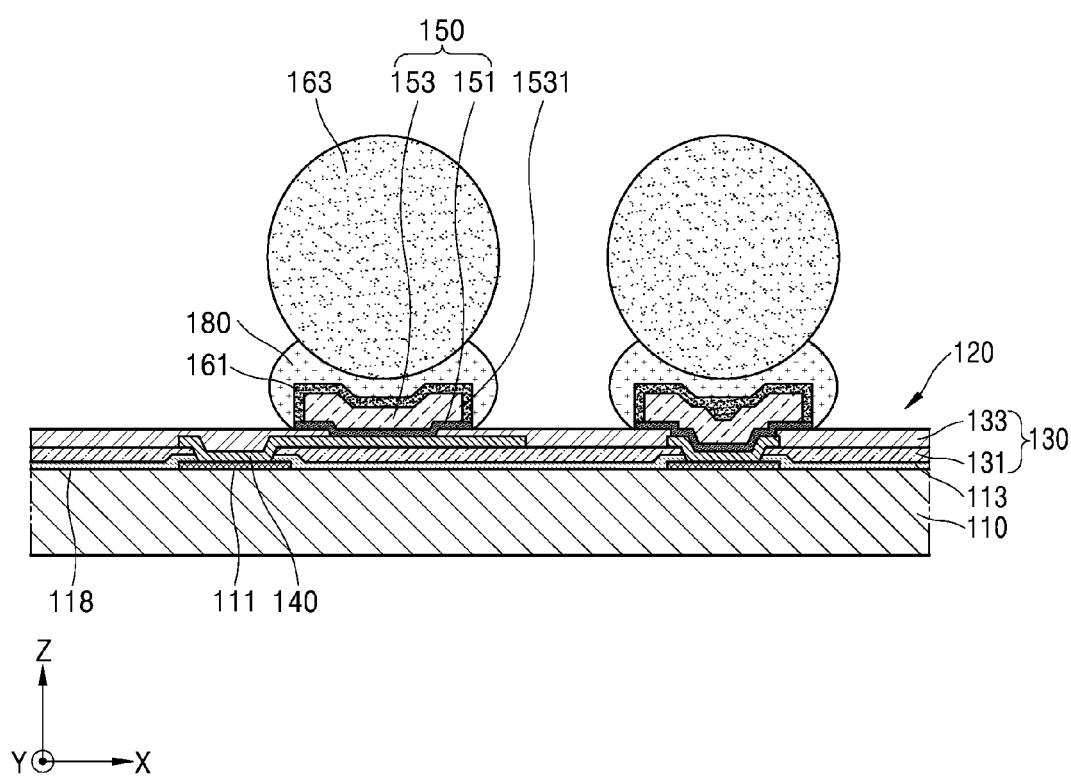

Referring to FIG. 7E, the flux 180 is applied onto the preliminary metal layer 161 and the solder ball 163 is placed on the preliminary metal layer 161, on which the flux 180 is applied. The solder ball 163 may have a spherical shape or a ball shape.

Figure 7F:
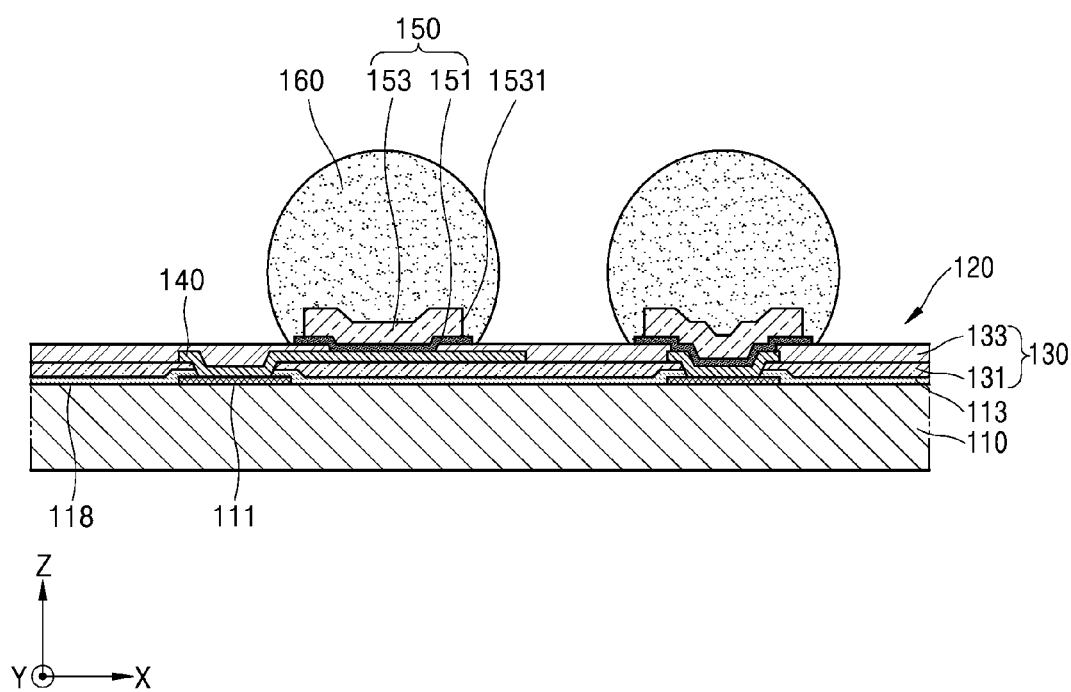

Referring to FIG. 7F, after placing the solder ball 163 (see FIG. 7E) on the preliminary metal layer 161 (see FIG. 7E), a reflow process may be performed to form the external connection terminal 160. During the reflow process, the solder ball 163 and the preliminary metal layer 161 are melted at a high temperature and solidified, and accordingly, the external connection terminal 160 may be formed, wherein the solder ball 163 and the preliminary metal layer 161 that are integrated with each other in the external connection terminal 160.

Since the reflow process is performed in a state in which the preliminary metal layer 161 is formed in advance, the external connection terminal 160 generated from the preliminary metal layer 161 may cover the side wall 1531 of the upper metal layer 153. In this case, on the side wall 1531 of the upper metal layer 153, the thickness of the external connection terminal 160 in the first direction (e.g., X-direction or Y-direction) may be equal to or greater than the thickness of the preliminary metal layer 161 in the first direction. For example, on the side wall 1531 of the upper metal layer 153, a minimum thickness of the external connection terminal 160 in the first direction may be 5 μm to 50 μm, or 10 μm to 30 μm.

After that, the semiconductor package manufactured at a wafer level is cut along a scribe lane to singulate the semiconductor package into semiconductor packages of individual unit.

According to one or more embodiments, since the reflow process is performed after forming the preliminary metal layer 161 (see FIG. 7D) covering the external pad 150 in advance, the external connection terminal 160 may completely cover the external pad 150. Since the external pad 150 is protected by the external connection terminal 160, damage to the external pad 150 may be prevented.

Figure 8:
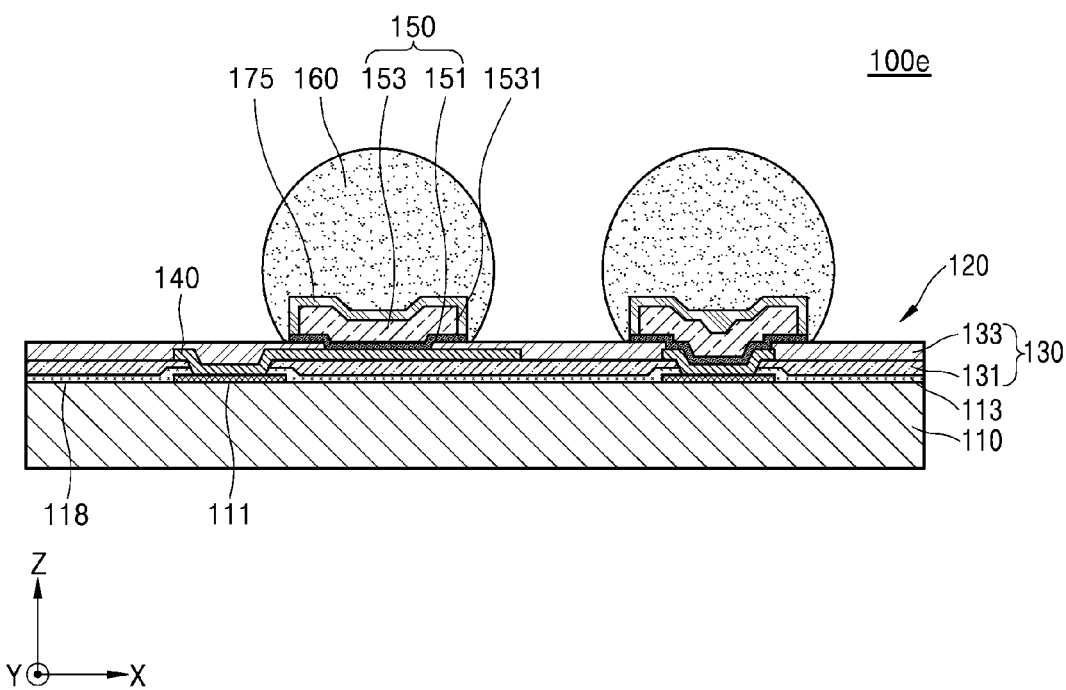
FIG. 8 is a cross-sectional view of a semiconductor package according to an embodiment.

FIG. 8 is a cross-sectional view of a semiconductor package 100e according to an embodiment. The semiconductor package 100e of FIG. 8 may have the same structure as that of the semiconductor package 100d shown in FIGS. 5 and 6, except that a diffusion barrier layer 175 is further provided. In FIG. 8, descriptions about the elements that are already described above with reference to FIGS. 5 and 6 are briefly provided or omitted.

Referring to FIG. 8, the semiconductor package 100e may include the semiconductor chip 110, and the redistribution structure 120, the external connection terminal 160, and the diffusion barrier layer 175 on the semiconductor chip 110.

The diffusion barrier layer 175 may be between the external connection terminal 160 and the external pad 150. The diffusion barrier layer 175 may cover, for example, the upper surface and the side wall 1531 of the upper metal layer 153. Also, the diffusion barrier layer 175 may cover the protrusion 1511 (see FIG. 6) of the lower metal layer 151, wherein the protrusion 1511 protrudes from the side wall 1531 of the upper metal layer 153.

For example, the diffusion barrier layer 175 may include Ni, Co, Cu, or a combination thereof.

In one or more embodiments, the diffusion barrier layer 175 may include a material different from that of the external connection terminal 160 and different from that of the external pad 150. For example, when the upper metal layer 153 of the external pad 150 includes Cu and the external connection terminal 160 includes Sn and Ag, the diffusion barrier layer 175 may include Ni or an alloy of Ni.

The diffusion barrier layer 175 is provided between the external connection terminal 160 and the external pad 150 to prevent excessive generation of the intermetallic compound due to the reaction between the external connection terminal 160 and the external pad 150.

Moreover, the diffusion barrier layer 175 may prevent exposure of the external pad 150 to outside by covering the external pad 150 and may prevent the damage to the external pad 150 caused by the exposure of the external pad 150 to outside. Thus, the reliability of the semiconductor package 100e may be improved.

Figure 9A:
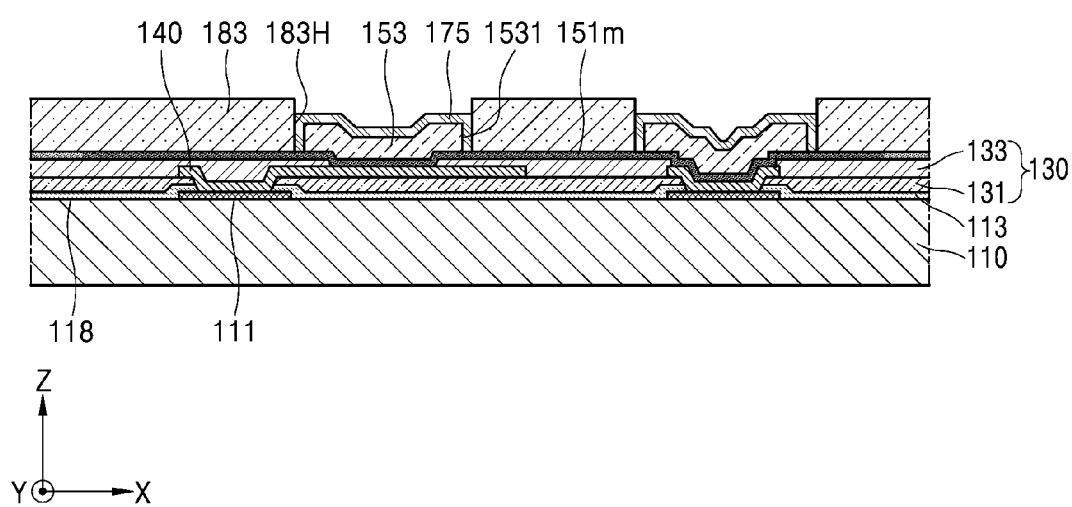
FIGS. 9A to 9C are cross-sectional views illustrating a method of manufacturing the semiconductor package of FIG. 8 according to a processing order.
Figure 9B:
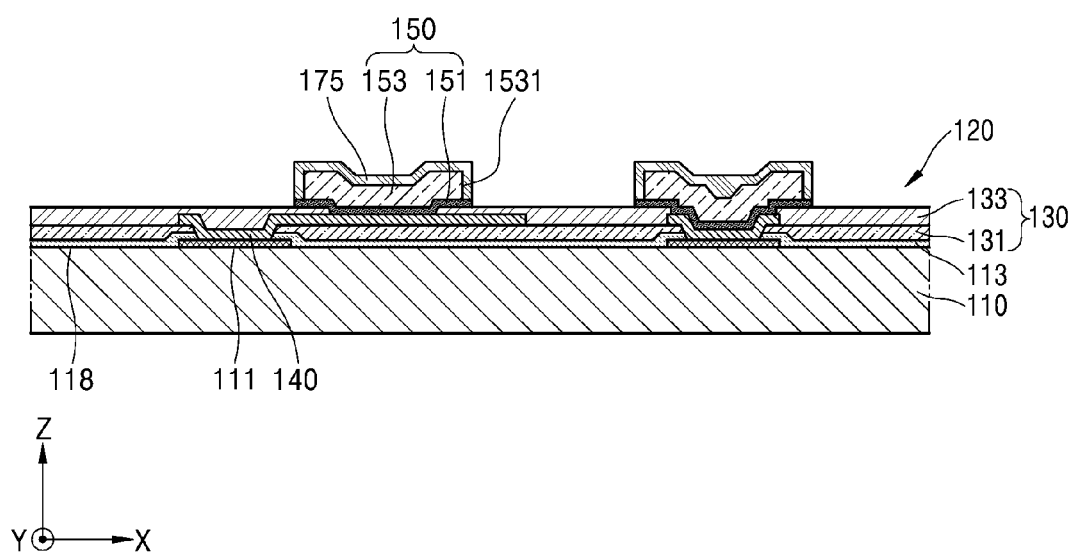
Figure 9C:
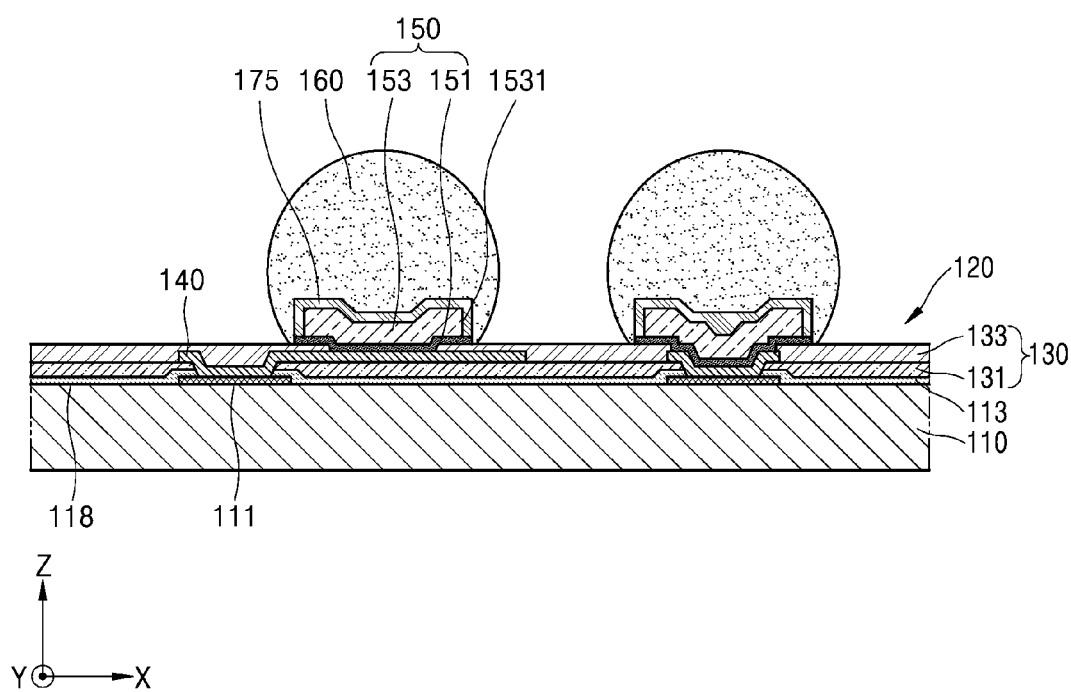

FIGS. 9A to 9C are cross-sectional views illustrating a method of manufacturing the semiconductor package 100e of FIG. 8 according to a processing order.

Referring to FIG. 9A, a structure corresponding to a resultant of the process shown in FIG. 4F is prepared, and the diffusion barrier layer 175 covering the external pad 150 is formed in the opening 183H of the second mask pattern 183. The diffusion barrier layer 175 may cover the upper surface of the upper metal layer 153, the side wall 1531 of the upper metal layer 153, and the lower metal layer 151m exposed between the side wall 1531 of the upper metal layer 153 and the internal wall of the second mask pattern 183. For example, the diffusion barrier layer 175 may be formed by a plating process.

In one or more embodiments, the diffusion barrier layer 175 may fill the space between the side wall 1531 of the upper metal layer 153 and the internal wall of the second mask pattern 183. Accordingly, a thickness of the diffusion barrier layer 175 in the first direction (e.g., X-direction or Y-direction), wherein the diffusion barrier layer 175 covers the side wall 1531 of the upper metal layer 153, may correspond to the separated distance between the side wall 1531 of the upper metal layer 153 and the internal wall of the second mask pattern 183. For example, the thickness of the diffusion barrier layer 175 covering the side wall 1531 of the upper metal layer 153 in the first direction may be 5 μm to 50 μm, or 10 μm to 30 μm.

Referring to FIG. 9B, after forming the diffusion barrier layer 175, the second mask pattern 183 (see FIG. 9A) is removed. The second mask pattern 183 (see FIG. 9A) may be removed by, for example, a strip process.

Referring to FIG. 9C, the external connection terminal 160 is formed on the diffusion barrier layer 175. Similarly to the descriptions above with reference to FIGS. 4G and 4H, the flux 180 (see FIG. 4G) is applied onto the diffusion barrier layer 175, the solder ball 163 (see FIG. 4H) is placed on the diffusion barrier layer 175, on which the flux 180 is applied, and the reflow process for melting and solidifying the solder ball may be performed, in order to form the external connection terminal 160.

After that, the semiconductor package manufactured at a wafer level is cut along a scribe lane to singulate the semiconductor package into semiconductor packages 100e of individual unit as shown in FIG. 8.

According to one or more embodiments, even when the external connection terminal 160 formed through the reflow process does not cover the side wall 1531 of the upper metal layer 153 in the external pad 150, the reflow process is performed in a state in which the diffusion barrier layer 175 covering the external pad 150 is formed in advance, and thus, the external pad 150 may be completely covered by the diffusion barrier layer 175.

Figure 10:
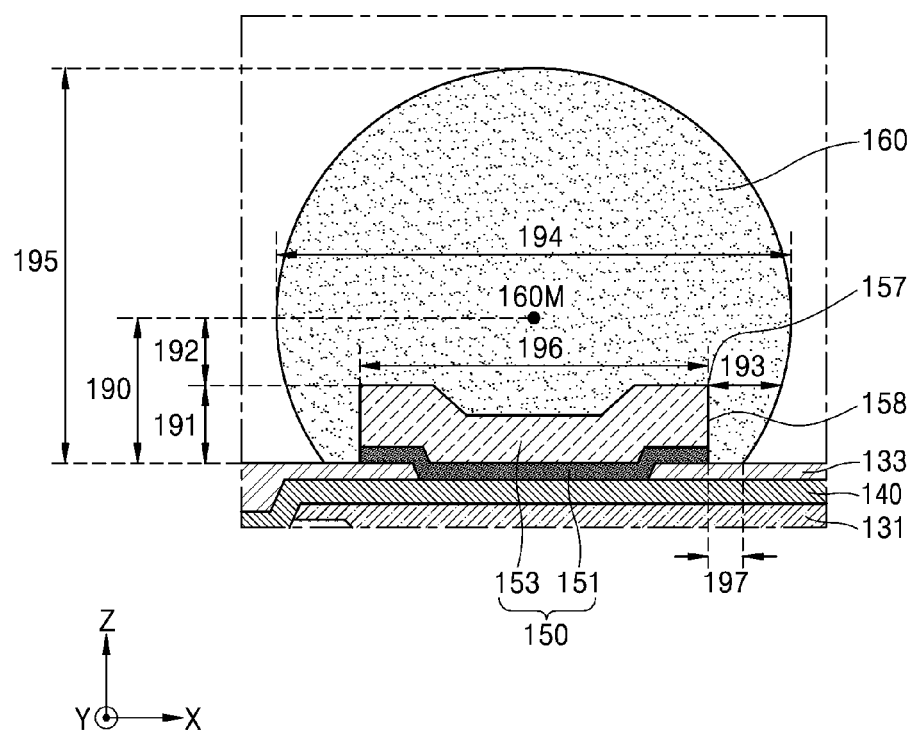
FIG. 10 is a cross-sectional view partially showing a semiconductor package according to an embodiment.

FIG. 10 is a cross-sectional view partially showing a semiconductor package according to an embodiment.

Referring to FIG. 10, a horizontal width 194 of the external connection terminal 160 may be greater than a height 195 of the external connection terminal 160. The horizontal width 194 of the external connection terminal 160 may denote a maximum value of the width of the external connection terminal 160 in the first direction (e.g., X-direction or Y-direction) that is in parallel with the first surface 118 of the semiconductor chip 110, or a distance between two points where an arbitrary straight line crossing a center 160M of the external connection terminal 160 in the first direction and the outer surface of the external connection terminal 160 meet each other. In addition, the height 195 of the external connection terminal 160 may be the height of the external connection terminal 160 in the second direction (e.g., Z-direction) based on the upper surface of the insulating pattern 130. In one or more embodiments, the horizontal width 194 of the external connection terminal 160 may be 1.2 to 1.4 times greater than the height 195 of the external connection terminal 160. For example, the horizontal width 194 of the external connection terminal 160 may be 210 μm to 250 μm. For example, the height 195 of the external connection terminal 160 may be 165 μm to 200 μm.

In one or more embodiments, a thickness 191 of the external pad 150 may be 0.09 to 0.5 times greater than the height 195 of the external connection terminal 160. When the thickness 191 of the external pad 150 is greater than 0.5 times of the height 195 of the external connection terminal 160, the side wall of the external pad 150 may not be covered by the external connection terminal 160 or the thickness of the external connection terminal 160 on the side wall of the external pad 150 may be reduced. Also, when the thickness 191 of the external pad 150 is less than 0.09 times of the height 195 of the external connection terminal 160, the size of the external connection terminal 160 is excessively increased as compared with the size of the external pad 150, and thus, the height 195 of the external connection terminal 160 is excessively increased and reliability in bonding between the semiconductor package 100 and an external device may degrade. In addition, electric short may occur between neighboring external connection terminals 160.

In one or more embodiments, the width 196 of the external pad 150 may be 0.6 to 0.9 times greater than the horizontal width 194 of the external connection terminal 160. When the width 196 of the external pad 150 is greater than 0.9 times of the horizontal width 194 of the external connection terminal 160, the side wall of the external pad 150 may not be covered by the external connection terminal 160 or the thickness of the external connection terminal 160 on the side wall of the external pad 150 may be reduced. Also, when the width 196 of the external pad 150 is less than 0.6 times of the horizontal width 194 of the external connection terminal 160, the size of the external connection terminal 160 is excessively increased as compared with the size of the external pad 150, and thus, the height 195 of the external connection terminal 160 is excessively increased and reliability in bonding between the semiconductor package 100 and an external device may degrade. In addition, electric short may occur between neighboring external connection terminals 160.

In one or more embodiments, on the side wall 158 of the external pad 150, the thickness of the external connection terminal 160 in the first direction (e.g., X-direction or Y-direction) may be at least of about 5 μm or greater. For example, on the side wall 158 of the external pad 150, the thickness of the external connection terminal 160 in the first direction may be at least 5 μm or greater. For example, the thickness of the external connection terminal 160 in the first direction may be 10 μm to 30 μm, between an uppermost end 157 on the side wall 158 of the external pad 150 and the external surface of the external connection terminal 160. For example, a thickness 197 of the external connection terminal 160 in the first direction may be 5 μm to 20 μm, between a lowermost end of the side wall 158 of the external pad 150 and the external surface of the external connection terminal 160.

In a cross-section of the external connection terminal 160, wherein the cross-section is in parallel with the first surface 118 of the semiconductor chip 110 and has a largest width in the first direction, when a center of the cross-section of the external connection terminal 160 is defined as a center 160M of the external connection terminal 160, the center 160M of the external connection terminal 160 may be lower than a center of an external connection terminal in a general package. As the center 160M of the external connection terminal 160 is lowered, the thickness of the external connection terminal 160 on the side wall 158 of the external pad 150 may be increased. For example, when a distance between the center 160M of the external connection terminal 160 and an upper surface of the insulating pattern 130 (See FIG. 9) in the second direction is a height 190 of the center 160M of the external connection terminal 160, the height 190 of the center 160M in the external connection terminal 160 may be equal to or less than 0.4 times, 0.35 times, or 0.3 times of the height 195 of the external connection terminal 160. When the height 190 of the center 160M in the external connection terminal 160 is greater than 0.4 times of the height 195 of the external connection terminal 160, the side wall 158 of the external pad 150 may not be covered by the external connection terminal 160 or the thickness of the external connection terminal 160 on the side wall of the external pad 150 may be excessively reduced. Also, in one or more embodiments, the height 190 of the center 160M in the external connection terminal 160 may be equal to or greater than 0.1 times, 0.15 times, or 0.2 times of the height 195 of the external connection terminal 160. When the height 190 of the center 160M in the external connection terminal 160 is less than 0.1 times of the height 195 of the external connection terminal 160, the height of the external connection terminal 160 may be excessively reduced.

The height 190 of the center 160M in the external connection terminal 160 may be adjusted according to a thickness 191 of the external pad 150, a width 198 of the external pad 150, and/or the horizontal width 194 of the external connection terminal 160.

The center 160M of the external connection terminal 160 may be apart from the external pad 150 in the second direction (e.g., Z-direction), but may be neighboring with the external pad 150. As the center 160M of the external connection terminal 160 is closer to the external pad 150, the thickness of the external connection terminal 160 covering the side wall 158 of the external pad 150 may be further increased. For example, a shortest distance 192 between the center 160M of the external connection terminal 160 and the external pad 150 in the second direction may be 0.5 times to 6 times greater than the thickness 191 of the external pad 150. For example, the shortest distance 192 between the center 160M of the external connection terminal 160 and the external pad 150 in the second direction may be 10 μm to 60 μm.

In one or more embodiments, in the second direction, the shortest distance 192 between the center 160M of the external connection terminal 160 and the external pad 150 in the second direction may be equal to or less than the thickness 191 of the external pad 150 in the second direction.

In a general semiconductor package, the intermetallic compound formed at an interface between the external pad and the external connection terminal may be exposed to outside, or the external connection terminal covering the intermetallic compound on the side wall of the external pad may be formed thin. Since the intermetallic compound is brittle due to the external shock, cracks frequently occur around edges of an upper surface of the external pad due to the external shock, and accordingly, reliability in bonding between the semiconductor package and the external device degrades.

Figure 11:
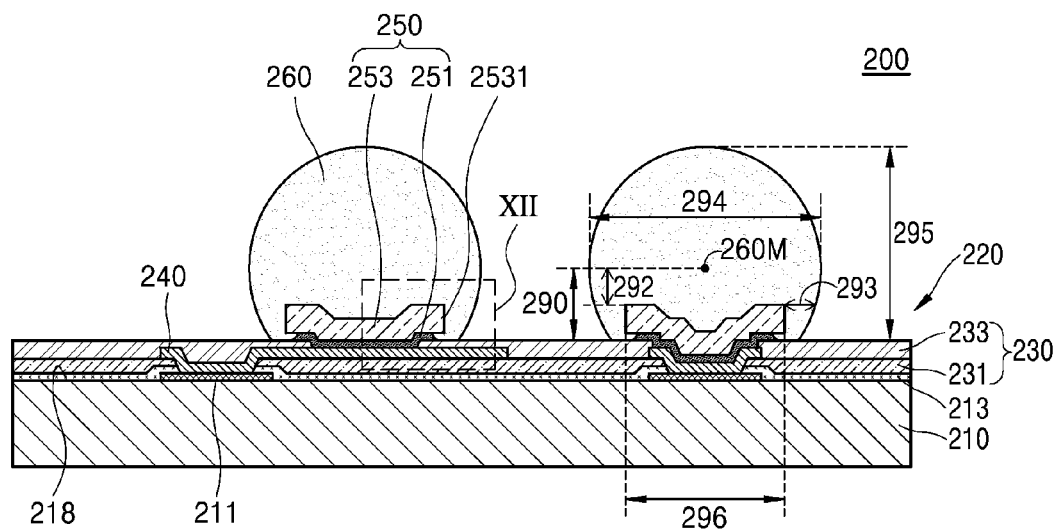
FIG. 11 is a cross-sectional view of a semiconductor package according to an embodiment.
Figure 12:
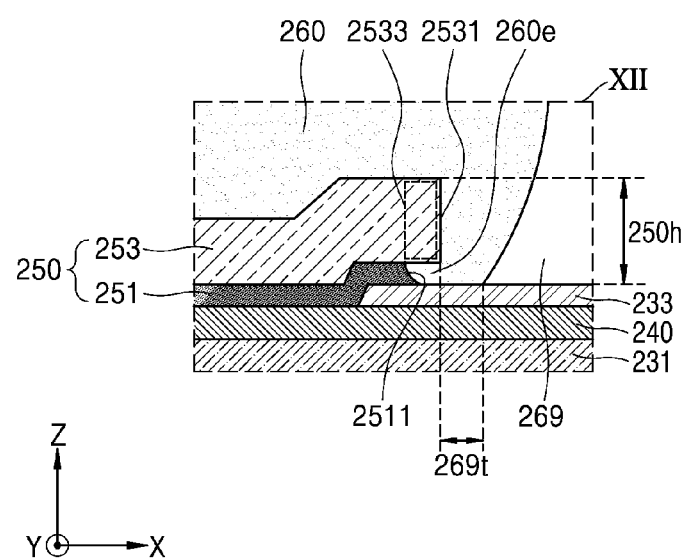
FIG. 12 is a cross-sectional view showing an enlarged view of a region XII of FIG. 11.

FIG. 11 is a cross-sectional view of a semiconductor package 200 according to an embodiment. FIG. 12 is a cross-sectional view showing an enlarged view of a region XII of FIG. 11.

Referring to FIGS. 11 and 12, the semiconductor package 200 may include a semiconductor chip 210, and a redistribution structure 220 and an external connection terminal 260 on the semiconductor chip 210.

A plurality of individual devices of various kinds may be formed in the semiconductor chip 210. For example, the plurality of individual devices may include various microelectronic devices, for example, a MOSFET such as a CMOS, an LSI, an image sensor such as a CIS, a MEMS, an active device, a passive device, etc.

The semiconductor chip 210 may include a chip pad 211 on a first surface 218. The chip pad 211 may be electrically connected to the individual devices formed in the semiconductor chip 210. Also, the semiconductor chip 210 may include a passivation layer 213 covering the first surface 218.

In one or more embodiments, the semiconductor chip 210 may include, for example, a memory semiconductor device. The memory semiconductor device may include, for example, a volatile memory semiconductor device such as DRAM or SRAM, or a non-volatile memory semiconductor device such as PRAM, MRAM, FeRAM, or an RRAM.

Alternatively, in one or more embodiments, the semiconductor chip 210 may include a logic chip. For example, the semiconductor chip 210 may include a CPU, an MPU, a GPU, or an AP.

In addition, the semiconductor package 200 includes one semiconductor chip 210 in FIG. 11, but the semiconductor package 100 may include two or more semiconductor chips 210. Two or more semiconductor chips 210 included in the semiconductor package 200 may include semiconductor chips of the same kind or different kinds. In some embodiments, the semiconductor package 200 may include a system-in-package (SIP) in which semiconductor chips of different kinds are electrically connected to one another to operate as one system.

The redistribution structure 220 may be on the first surface 218 of the semiconductor chip 210. The redistribution structure 220 may include the insulating pattern 230, the wiring pattern 240, and the external pad 250.

The insulating pattern 230 may be on the first surface 218 of the semiconductor chip 210. The insulating pattern 230 may have a structure, in which a plurality of insulating layers are laminated, for example, the insulating pattern 230 may include a first insulating pattern 231 and a second insulating pattern 233 that are sequentially stacked on the first surface 218 of the semiconductor chip 210.

For example, each of the first insulating pattern 231 and the second insulating pattern 233 may include an insulating polymer, epoxy, a silicon oxide layer, a silicon nitride layer, or a combination thereof.

The wiring pattern 240 may be provided in the insulating pattern 230 for electrically connecting the chip pad 211 of the semiconductor chip 210 to the external pad 250. In more detail, a part of the wiring pattern 240 may be connected to the chip pad 211 of the semiconductor chip 210 via an opening in the first insulating pattern 231, and another part of the wiring pattern 240 may extend along a surface of the first insulating pattern 231. For example, the wiring pattern 240 may include W, Cu, Zr, Ti, Ta, Al, Ru, Pd, Pt, Co, Ni, or a combination thereof.

In FIG. 11, the wiring pattern 240 has a single-layered structure, but the wiring pattern 240 may include a multi-layered structure in which a plurality of wiring layers are vertically laminated.

The external pad 250 is on the second insulating pattern 233 and may function as a pad on which the external connection terminal 260 is placed. The external pad 250 may be connected to the wiring pattern 240 via the opening in the second insulating pattern 233 and may be electrically connected to the chip pad 211 of the semiconductor chip 210 via the wiring pattern 240.

The external pad 250 may have a thickness greater than that of the wiring pattern 240. For example, as compared with the wiring pattern 240 having a thickness of about 3 μm to about 8 μm, the external pad 250 may have a thickness of 10 μm or greater. The thickness of the external pad 250 may be equal to sum of a thickness of an upper metal layer 253 and a thickness of a lower metal layer 251, wherein the upper metal layer 253 and the lower metal layer 251 will be described later. In one or more embodiments, a ratio of a thickness T2 of the external pad 250 with respect to a thickness T1 of the wiring pattern 240 (that is, T2/T1) may be about 1.25 to about 40, about 2 to about 35, or about 5 to about 20. When the ratio of the thickness of the external pad 250 with respect to the thickness of the wiring pattern 240 is relatively too small, the intermetallic compound grows less and an adhesive force may be reduced. On the other hand, when the ratio is relatively too large, the thickness of the semiconductor device may be excessively increased.

With respect to a second direction (e.g., Z-direction) perpendicular to the first surface 218 of the semiconductor chip 210, a height 250h of the external pad 250 may denote a height of the external pad 250 in the second direction based on an upper surface of the second insulating pattern 233. In one or more embodiments, the height 250h of the external pad 250 may be about 10 μm to about 120 μm. In one or more embodiments, the height 250h of the external pad 250 may be about 20 μm to about 50 μm, or about 30 μm.

The external pad 250 may include the lower metal layer 251 and the upper metal layer 253 on the lower metal layer 251.

The lower metal layer 251 may be formed on the wiring pattern 240 that is exposed through the opening of the second insulating pattern 233 and may extend along a surface of the second insulating pattern 233. The lower metal layer 251 may act as, for example, a seed layer or an adhesive layer for forming the upper metal layer 253. For example, the lower metal layer 251 may include Ti, Cu, Cr, W, Ni, Al, Pd, Au, or a combination thereof.

In one or more embodiments, the lower metal layer 251 may include one metal layer, but may have a multi-layered structure including a plurality of metal layers. For example, the lower metal layer 251 may include a first sub-metal layer and a second sub-metal layer that are sequentially laminated on the second insulating pattern 233 and the wiring pattern 240. The first sub-metal layer may include a metal material having an excellent adhesive characteristic with respect to the second insulating pattern 233. For example, the first sub-metal layer may include Ti. The second sub-metal layer may function as a seed layer for forming the upper metal layer 253. For example, the second sub-metal layer may include Cu.

The upper metal layer 253 may be provided on the lower metal layer 251. The upper metal layer 253 may be formed, for example, by a plating method using the lower metal layer 251 as a seed. The upper metal layer 253 has a pillar shape on the insulating pattern 230 and may have a depressed center. The upper metal layer 253 may have a side wall 2531 that is perpendicular to the first surface 218 of the semiconductor chip 210. In one or more embodiments, the upper metal layer 253 may include Cu or a Cu alloy, but is not limited thereto.

In one or more embodiments, the upper metal layer 253 may have a thickness of about 10 μm to about 100 μm, about 15 μm to about 80 μm, or about 20 μm to about 60 μm.

In one or more embodiments, the lower metal layer 251 may have a thickness of about 1 μm to about 20 μm, about 3 μm to about 15 μm, or about 4 μm to about 10 μm.

In one or more embodiments, the lower metal layer 251 may have a lateral profile located inside the side wall 2531 of the upper metal layer 253. That is, a side wall 2511 of the lower metal layer 251 may be retreated inward from the side wall 2531 of the upper metal layer 253, towards a center of the lower metal layer 251. In other words, the upper metal layer 253 may include a protrusion 2533 protruding from the lower metal layer 251 in a lateral direction.

In one or more embodiments, the side wall 2511 of the lower metal layer 251 may have a profile that is concave towards the center of the lower metal layer 251. The concave profile may include, for example, a circular arc, a parabola, an elliptical arc, etc. In some embodiments, the side wall 2511 of the lower metal layer 251 may have a profile that is substantially straight in a vertical direction (Z-direction).

The side wall 2511 of the lower metal layer 251 may be located on a surface of the second insulating pattern 233. That is, a central portion of the lower metal layer 251 is in contact with the wiring pattern 240, but an edge of the lower metal layer 251 may extend to an upper portion of the second insulating pattern 233.

In the first direction (e.g., X-direction or Y-direction) that is in parallel with the first surface 218 of the semiconductor chip 210, the side wall 2511 of the lower metal layer 251 may be retreated from the side wall 2531 of the upper metal layer 253 towards the center of the lower metal layer 251 by a first width. The first width may be, for example, about 0.1 μm to about 50 μm, about 8 μm to about 30 μm, or about 10 μm to about 25 μm. However, one or more embodiments are not limited thereto.

The external connection terminal 260 may be on the external pad 250. The external connection terminal 260 may be a chip-substrate connection terminal for mounting the semiconductor package 200 on an external substrate. In one or more embodiments, the external connection terminal 260 may have a spherical shape or a ball shape. For example, the external connection terminal 260 may include Sn, Ag, In, Bi, Sb, Cu, Zn, Pb, and/or an alloy thereof.

In one or more embodiments, the external connection terminal 260 may cover the external pad 250. For example, the external connection terminal 260 may cover an upper surface and the side wall 2531 of the upper metal layer 253. Also, the external connection terminal 260 may partially cover a surface of the second insulating pattern 233 near the external pad 250. The external connection terminal 260 may be in surface contact with the surface of the second insulating pattern 233.

In one or more embodiments, in the first direction (e.g., X-direction or Y-direction) that is in parallel with the first surface 218 of the semiconductor chip 210, when a part of the external connection terminal 260, which overlaps the side walls 2511 and 2531 of the lower metal layer 251 and the upper metal layer 253 in the first direction, is defined as a first portion 269 of the external connection terminal 260, a minimum thickness 269t of the first portion 269 of the external connection terminal 260 in the first direction based on the side wall 2531 of the upper metal layer 253 may be about 5 μm to about 50 μm, or about 10 μm to about 30 μm.

In other words, the minimum distance between the side wall of the upper metal layer 253 and an outer circumferential surface of the first portion 269 in the external connection terminal 260 in the first direction may be 5 μm to 50 μm, or 10 μm to 30 μm.

The external connection terminal 260 may include an extension 260e that extends towards a lower portion of the protrusion 2533. The extension 260e may be a part of the first portion 269. An upper portion of the extension 260e may be in contact with a lower surface of the upper metal layer 253 and a lower portion of the extension 260e may be in contact with an upper surface of the second insulating pattern 233. Moreover, the extension 260e may be at least partially in contact with the side wall 2511 of the lower metal layer 251. In some embodiments, the extension 260e may extend into the concave portion of the side wall 2511.

The extension 260e may extend by about 5 μm to about 50 μm, about 8 μm to about 30 μm, or about 10 μm to about 25 μm towards a center of the lower metal layer 251 in a horizontal direction from the side wall 2531 of the upper metal layer 253.

According to one or more embodiments, the external connection terminal 260 may completely cover the external pad 250 to prevent the external pad 250 from being exposed to outside, and to prevent damage to the external pad 250 due to the exposure of the external pad 250 to outside. Moreover, since the external connection terminal 260 extends to the lower portion of the upper metal layer 253 of the external pad 250 to increase a contact area between the external connection terminal 260 and the external pad 250, the reliability of the semiconductor package 200 may be improved.

In one or more embodiment, a horizontal width 294 of the external connection terminal 260 may be greater than the height 295 of the external connection terminal 260. The horizontal width 294 of the external connection terminal 260 may denote a maximum value of the width of the external connection terminal 260 in the first direction (e.g., X-direction or Y-direction) that is in parallel with the first surface 218 of the semiconductor chip 210, or a distance between two points where an arbitrary straight line crossing a center 260M of the external connection terminal 260 in the first direction and the outer surface of the external connection terminal 260 meet each other. In addition, the height 295 of the external connection terminal 260 may be the height of the external connection terminal 260 in the second direction (e.g., Z-direction) based on the upper surface of the insulating pattern 230. In one or more embodiments, the horizontal width 294 of the external connection terminal 260 may be 1.2 to 1.4 times greater than the height 295 of the external connection terminal 260. For example, the horizontal width 294 of the external connection terminal 260 may be 210 μm to 250 μm. For example, the height 295 of the external connection terminal 260 may be 165 μm to 200 μm.

In one or more embodiments, a height 250h of the external pad 250 may be 0.09 to 0.5 times greater than the height 295 of the external connection terminal 260. When the height 250h of the external pad 250 is greater than 0.5 times of the height 295 of the external connection terminal 260, the side wall of the external pad 250 may not be covered by the external connection terminal 260 or the thickness of the external connection terminal 260 on the side wall of the external pad 250 may be reduced. Also, when the height 250h of the external pad 250 is less than 0.09 times of the height 295 of the external connection terminal 260, the size of the external connection terminal 260 is excessively increased as compared with the size of the external pad 250, and thus, the height 295 of the external connection terminal 260 is excessively increased and reliability in bonding between the semiconductor package 200 and an external device may degrade. In addition, electric short may occur between neighboring external connection terminals 260.

In one or more embodiments, the width 296 of the external pad 250 may be 0.6 to 0.9 times greater than the horizontal width 294 of the external connection terminal 260. When the width 296 of the external pad 250 is greater than 0.9 times of the horizontal width 294 of the external connection terminal 260, the side wall of the external pad 250 may not be covered by the external connection terminal 260 or the thickness of the external connection terminal 260 on the side wall of the external pad 250 may be excessively reduced. Also, when the width 296 of the external pad 250 is less than 0.6 times of the horizontal width 294 of the external connection terminal 260, the size of the external connection terminal 260 is excessively increased as compared with the size of the external pad 250, and thus, the height 295 of the external connection terminal 260 is excessively increased and reliability in bonding between the semiconductor package 200 and an external device may degrade. In addition, electric short may occur between neighboring external connection terminals 260.

In a cross-section of the external connection terminal 260 that is in parallel with the first surface 218 of the semiconductor chip 210 and has the largest width in the first direction (e.g., X-direction or Y-direction), when a center of the cross-section of the external connection terminal 260 is defined as a center 260M of the external connection terminal 260, the center 260M of the external connection terminal 260 may be lower than a center of an external connection terminal in a general semiconductor package. As the center 260M of the external connection terminal 260 is lowered, the thickness of the external connection terminal 260 on the side wall 2531 of the external pad 250 may be increased. For example, when a distance between the center 260M of the external connection terminal 260 and an upper surface of the insulating pattern 230 in the second direction (e.g., Z-direction) is a height 290 of the center 260M of the external connection terminal 260, the height 290 of the center 260M in the external connection terminal 260 may be equal to or less than 0.4 times, 0.35 times, or 0.3 times of the height 295 of the external connection terminal 260. When the height 290 of the center 260M in the external connection terminal 260 is greater than 0.4 times of the height 295 of the external connection terminal 260, the side wall of the external pad 250 may not be covered by the external connection terminal 260 or the thickness of the external connection terminal 260 on the side wall of the external pad 250 may be excessively reduced. Also, in one or more embodiments, the height 290 of the center 260M in the external connection terminal 260 may be equal to or greater than 0.1 times, 0.15 times, or 0.2 times of the height 295 of the external connection terminal 260. When the height 290 of the center 260M in the external connection terminal 260 is less than 0.1 times of the height 295 of the external connection terminal 260, the height of the external connection terminal 260 is excessively reduced.

The height 290 of the center 260M in the external connection terminal 260 may be adjusted according to the height 250h of the external pad 250, the width 296 of the external pad 250, and/or the horizontal width 294 of the external connection terminal 260.

The center 260M of the external connection terminal 260 may be apart from the external pad 250 in the second direction (e.g., Z-direction), but may be neighboring with the external pad 250. As the center 260M of the external connection terminal 260 is closer to the external pad 250, the thickness of the external connection terminal 260 covering the side wall 2531 of the external pad 250 may be further increased. For example, a shortest distance 292 between the center 260M of the external connection terminal 260 and the external pad 250 in the second direction may be 0.5 times to 6 times greater than the height 250h of the external pad 250. For example, the shortest distance 292 between the center 260M of the external connection terminal 260 and the external pad 250 in the second direction may be 10 μm to 60 μm.

In one or more embodiments, in the second direction, the shortest distance 292 between the center 260M of the external connection terminal 260 and the external pad 250 in the second direction may be equal to or less than the height 250h of the external pad 250 in the second direction.

FIGS. 13A to 13K are cross-sectional views illustrating a method of manufacturing the semiconductor package 200 of FIG. 11 according to a processing order.

Figure 13A:
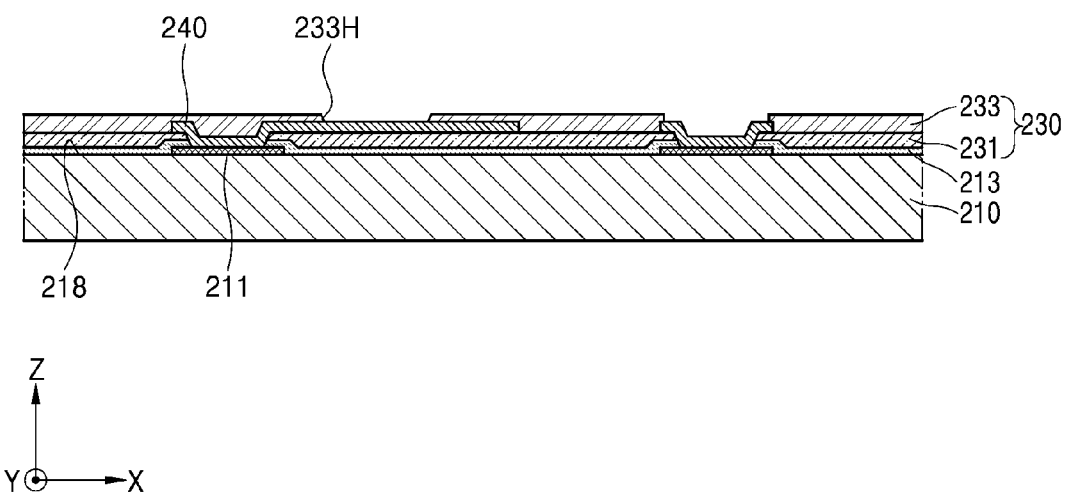
FIGS. 13A to 13K are cross-sectional views illustrating a method of manufacturing the semiconductor package of FIG. 11 according to a processing order.

Referring to FIG. 13A, the first insulating pattern 231 is formed on the first surface 218 of the semiconductor chip 210. For example, for forming the first insulating pattern 231, a first insulating layer covering the first surface 218 of the semiconductor chip 210 may be formed, and then, the first insulating layer may be partially removed to expose the chip pad 211 of the semiconductor chip 210.

In some embodiments, a passivation layer 213 exposing the chip pad 211 may be formed before forming the first insulating pattern 231. The passivation layer 213 may be formed by coating an entire surface of the first surface 218 with a passivation material layer and patterning the passivation material layer to expose the chip pad 211. The passivation material layer may include, for example, silicon nitride, silicon oxynitride, silicon oxide, etc., and may be formed by a physical vapor deposition (PVD) method, a chemical vapor deposition (CVD) method, etc.

After forming the first insulating pattern 231, the wiring pattern 240 is formed on the first insulating pattern 231. The wiring pattern 240 may be formed on the first insulating pattern 231 and the chip pad 211 of the semiconductor chip 210, wherein the chip pad 211 is exposed through the first insulating pattern 231. For example, the wiring pattern 240 may be formed by a seed layer forming process, a mask process, and a plating process.

After forming the wiring pattern 240, the second insulating pattern 233 is formed on the first insulating pattern 231. The second insulating pattern 233 may include an opening 233H for partially exposing the wiring pattern 240. For example, a second insulating layer covering the first insulating pattern 231 and the wiring pattern 240 may be formed in order to form the second insulating pattern 233, and then the second insulating layer may be partially removed to form the opening 233H that partially exposes the wiring pattern 240.

Figure 13B:
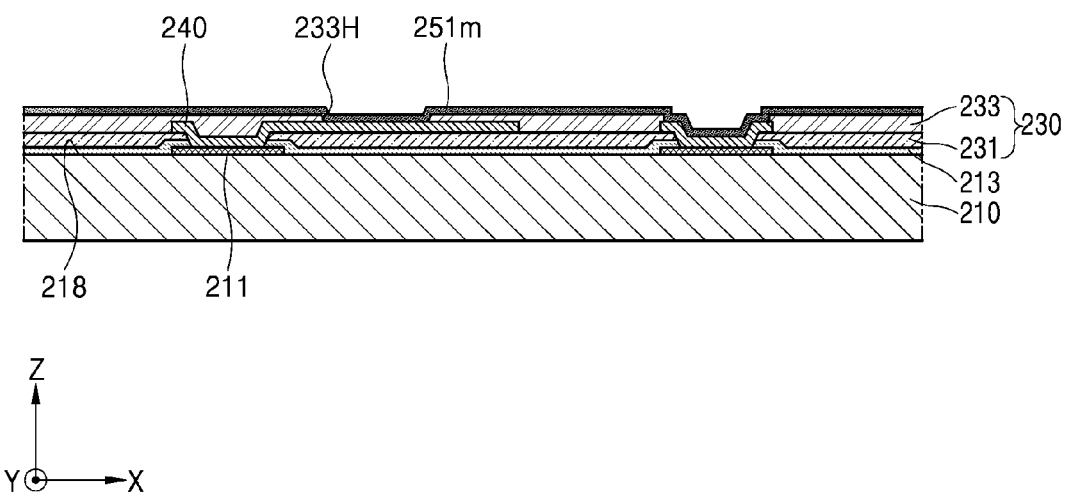

Referring to FIG. 13B, a lower metal layer 251m covering the second insulating pattern 233 and the wiring pattern 240 that is exposed through the opening 233H of the second insulating pattern 233 is formed. The lower metal layer 251*m* may be formed by, for example, a sputtering process. The lower metal layer 251*m* may include, for example, Ti, Cu, Cr, W, Ni, Al, Pd, Au, or a combination thereof.

Figure 13C:
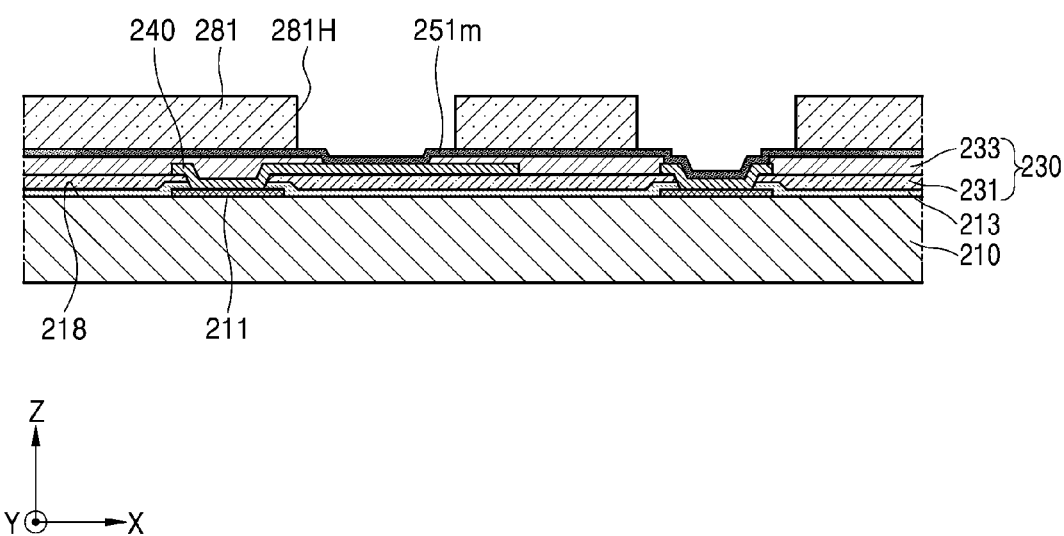

Referring to FIG. 13C, after forming the lower metal layer 251*m*, a first mask pattern 281 is formed on the lower metal layer 251*m*. The first mask pattern 281 may include an opening 281H that partially exposes the lower metal layer 251*m*. For example, the first mask pattern 281 may be obtained by forming a photosensitive material layer on the lower metal layer 251*m* and patterning the photosensitive material layer by an exposure process and a development process performed on the photosensitive material layer.

Figure 13D:
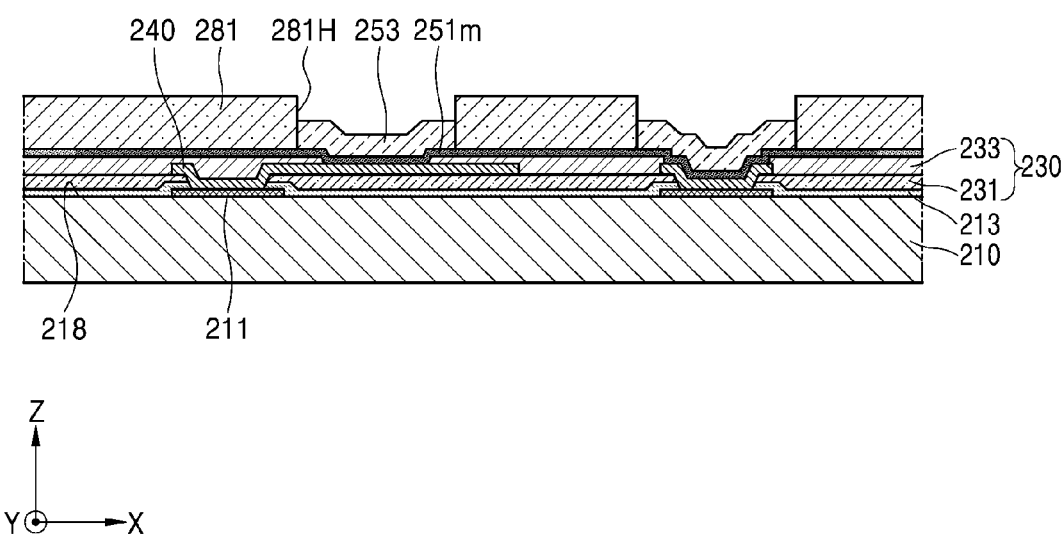

Referring to FIG. 13D, after forming the first mask pattern 281, the upper metal layer 253 is formed in the opening 281H of the first mask pattern 281. The upper metal layer 253 may be formed by a plating process in which the lower metal layer 251*m* is used as a seed. In some embodiments, the plating process may be an electroplating process.

Figure 13E:
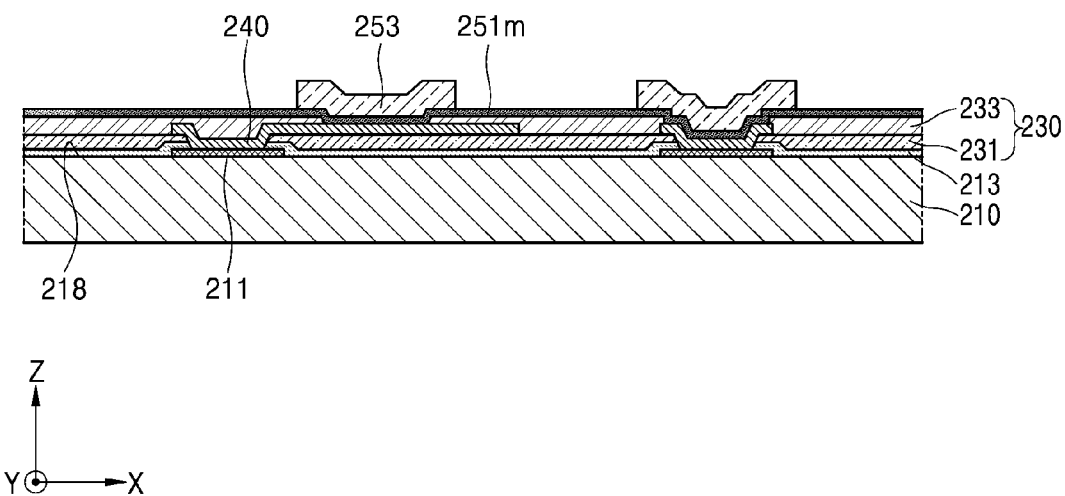

Referring to FIG. 13E, after forming the upper metal layer 253, the first mask pattern 281 (see FIG. 13D) on the upper metal layer 251*m* is removed. The first mask pattern 281 (see FIG. 13D) may be removed by, for example, a strip process.

Figure 13F:
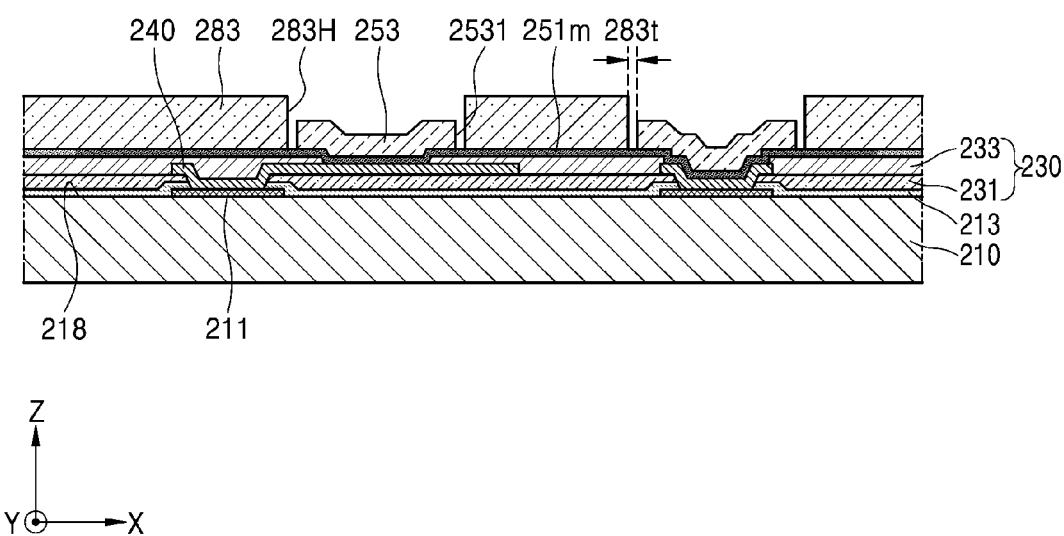

Referring to FIG. 13F, after removing the first mask pattern 281 (see FIG. 13D), a second mask pattern 283 is formed on the lower metal layer 251*m*. The second mask pattern 283 may include an opening 283H for exposing the upper metal layer 253. For example, the second mask pattern 283 may be obtained by forming a photosensitive material layer on the lower metal layer 251*m* and patterning the photosensitive material layer by an exposure process and a development process performed on the photosensitive material layer.

In one or more embodiments, the opening 283H of the second mask pattern 283 may have a width that is greater than that of the upper metal layer 253. The upper surface and the side wall 2531 of the upper metal layer 253 may be exposed through the opening 283H of the second mask pattern 283, and the lower metal layer 251*m* around the side wall 2531 of the upper metal layer 253 may be partially exposed.

The internal wall of the second mask pattern 283, which is formed by the opening 283H of the second mask pattern 283, may be separated a predetermined distance 283*t* from the side wall 2531 of the upper metal layer 253. In one or more embodiments, in the first direction (e.g., X-direction or Y-direction) that is in parallel with the first surface 218 of the semiconductor chip 210, the distance 283*t* between the side wall 2531 of the upper metal layer 253 and the internal wall of the second mask pattern 283 may be 5 µm to 50 µm, or 10 µm to 30 µm.

Figure 13G:
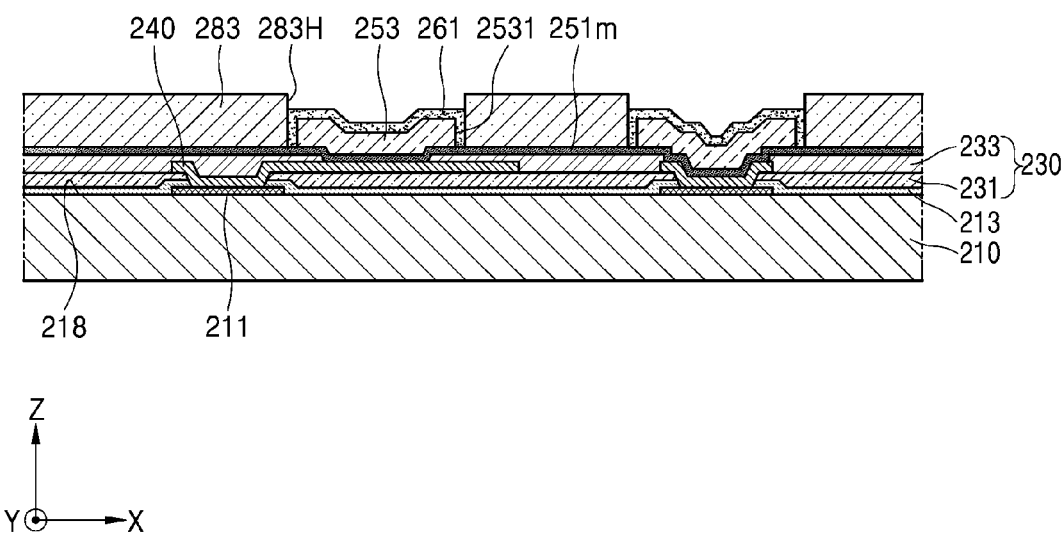

Referring to FIG. 13G, after forming the second mask pattern 283, a preliminary external connection terminal layer 261 covering the external pad 250 is formed in the opening 283H of the second mask pattern 283. For example, the preliminary external connection terminal layer 261 may cover the upper surface of the upper metal layer 253, the side wall 2531 of the upper metal layer 253, and the lower metal layer 251*m* exposed between the side wall 2531 of the upper metal layer 253 and the internal wall of the second mask pattern 283. For example, the preliminary external connection terminal layer 261 may be formed by a plating process.

For example, the preliminary external connection terminal layer 261 may include Sn, Ag, In, Bi, Sb, Cu, Au, Zn, Pb, and/or an alloy thereof. In one or more embodiments, the preliminary external connection terminal layer 261 may include a material that is the same as a material included in a solder ball 263 (FIG. 13J) that will be placed on the preliminary external connection terminal layer 261 through a post-process. In some embodiments, the preliminary external connection terminal layer 261 may include a single metal material, e.g., Au layer. In some embodiments, the preliminary external connection terminal layer 261 may be a stack structure in which single metal layers are stacked.

In one or more embodiments, the preliminary external connection terminal layer 261 may fill a space between the side wall 2531 of the upper metal layer 253 and the internal wall of the second mask pattern 283. Accordingly, a thickness of the preliminary external connection terminal layer 261 that covers the side wall 2531 of the upper metal layer 253 in the first direction (e.g., X-direction or Y-direction) may correspond to a distance 283*t* (see FIG. 13F) between the side wall 2531 of the upper metal layer 253 and the internal wall of the second mask pattern 283. For example, the thickness of the preliminary external connection terminal layer 261 in the first direction, wherein the preliminary external connection terminal layer 261 covers the side wall 2531 of the upper metal layer 253, may be 5 µm to 50 µm, or 10 µm to 30 µm.

Figure 13H:
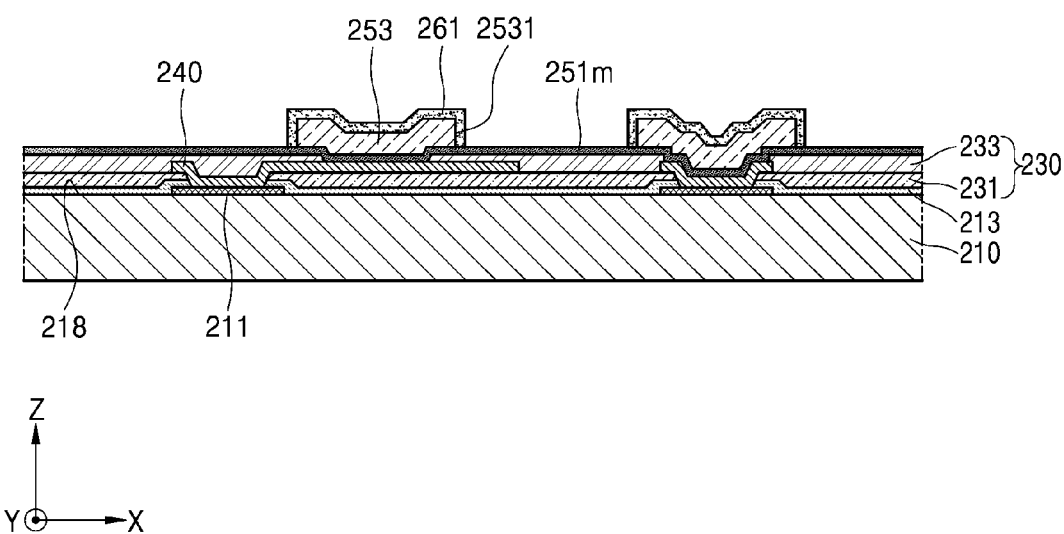

Referring to FIG. 13H, after forming the preliminary external connection terminal layer 261, the second mask pattern 283 (see FIG. 13G) is removed. The second mask pattern 283 (see FIG. 13G) may be removed by, for example, a strip process.

Figure 13I:
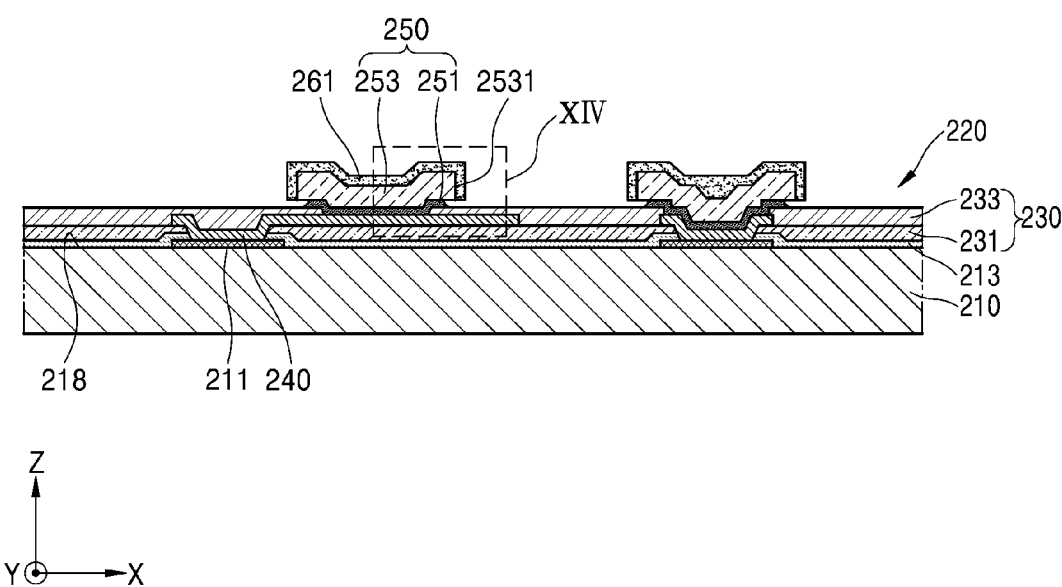

Referring to FIG. 13I, after removing the second mask pattern 283 (see FIG. 13G), the lower metal layer 251*m* (see FIG. 13G) that is exposed due to the removal of the second mask pattern 283 (see FIG. 13G) is partially removed. That is, a first portion of the lower metal layer 251*m* (see FIG. 13G), wherein the first portion is covered by the preliminary external connection terminal layer 261 and the upper metal layer 253, remains and a second portion of the lower metal layer 251*m* (see FIG. 13G), wherein the second portion is exposed due to the removal of the second mask pattern 283 (see FIG. 13G), may be removed. For example, the second portion of the lower metal layer 251*m* (see FIG. 13G) may be removed by an etching process.

The second portion of the lower metal layer 251*m* (see FIG. 13G) may be removed by an isotropic etching. In the lower metal layer 251*m* (see FIG. 13G), the edge of the portion (e.g., first portion) covered by the preliminary external connection terminal layer 261 and the upper metal layer 253, as well as the portion under the second mask pattern 283 (see FIG. 13G), that is, the second portion, may be also partially removed. Due to the partial removal on the edge of the first portion, the side wall of the lower metal layer 251 may have a lateral profile located inside the side wall 2531 of the upper metal layer 253. That is, a side wall 2511 (see FIG. 12) of the lower metal layer 251 may be retreated inward from the side wall 2531 of the upper metal layer 253, towards a center of the lower metal layer 251.

Figure 14:
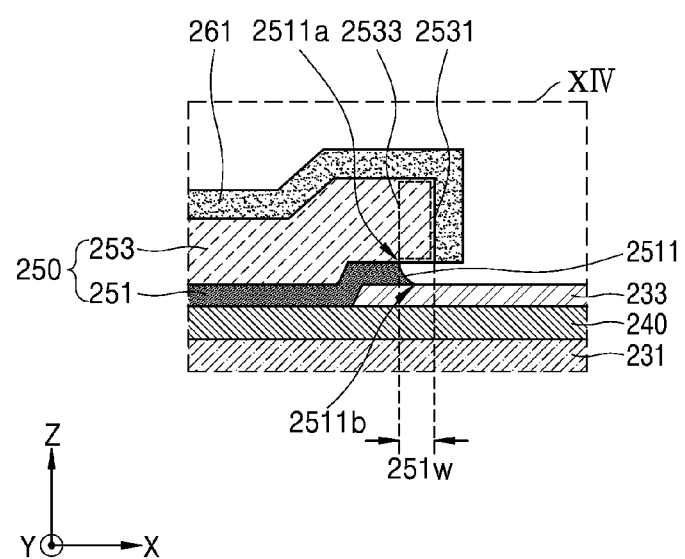
FIG. 14 is a partially enlarged view of a region XIV of FIG. 13I.

FIG. 14 is a partially enlarged view of a portion XIV of FIG. 13I.

Referring to FIG. 14, the side wall 2511 of the lower metal layer 251 may have a concave surface. In detail, the side wall 2511 may have a profile that is concave towards the center of the lower metal layer 251. In some embodiments, the side wall 2511 has a proximal end 2511*a* which meets the upper metal layer 253 and a proximal end 2511*b* which meets the second insulating pattern 233, and the proximal end 2511*a* may be retreated more than the proximal end 2511*b* towards the center of the lower metal layer 251.

That is, the side wall 2511 of the lower metal layer 251 may be retreated inward from the side wall 2531 of the upper metal layer 253 as much as a first width 251W, towards a center of the lower metal layer 251. Here, the first width 251W may be based on a point that is most retreated from the side wall 2531 of the upper metal layer 253 in the profile of the side wall 2511 of the lower metal layer 251.

In some embodiments, the first width 251W may be about 5 μm to about 50 μm, about 8 μm to about 30 μm, or about 10 μm to about 25 μm. However, one or more embodiments are not limited thereto.

Figure 13J:
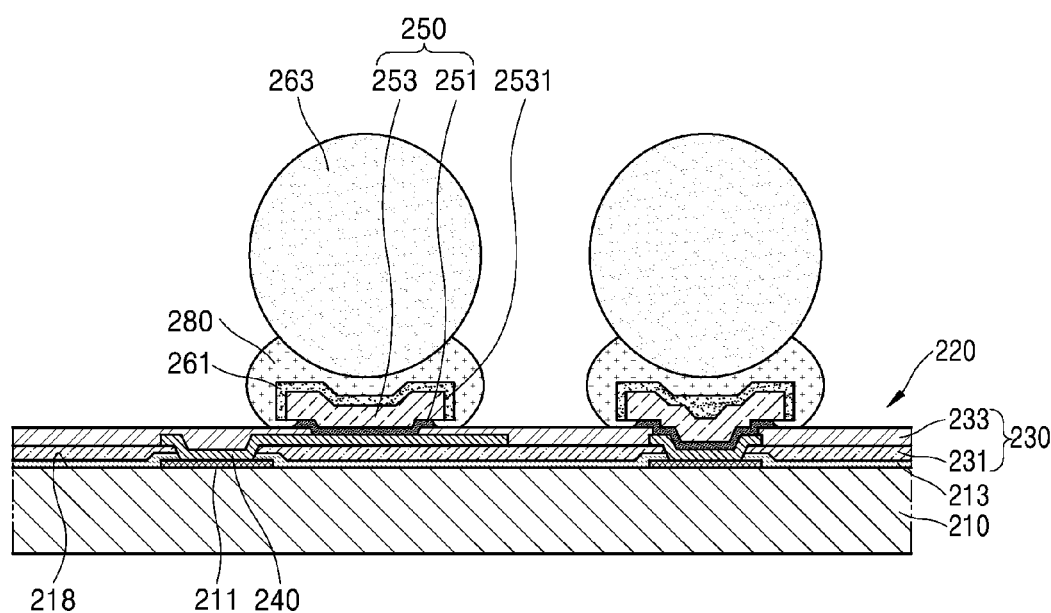
Figure 13J:
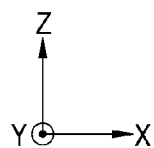

Referring to FIG. 13J, the flux 280 is applied onto the preliminary external connection terminal layer 261, and the solder ball 263 is placed on the preliminary external connection terminal layer 261, on which the flux 280 is applied. The solder ball 263 may have a spherical shape or a ball shape.

Figure 13K:
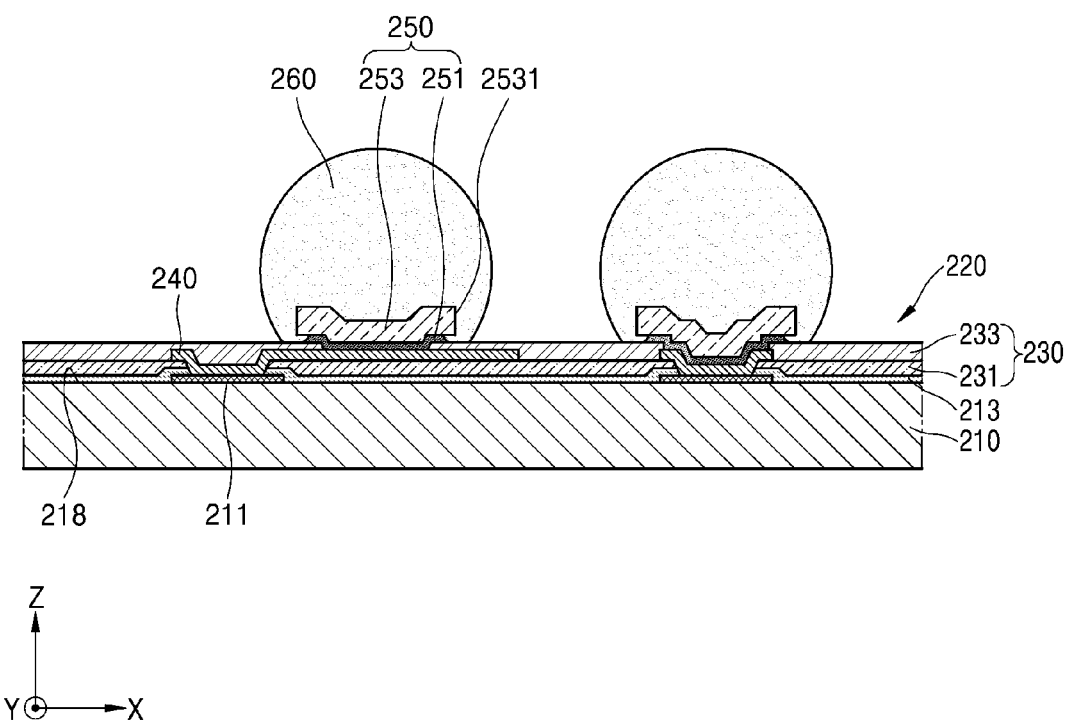

Referring to FIG. 13K, after placing the solder ball 263 (see FIG. 13J) on the preliminary external connection terminal layer 261 (see FIG. 13J), a reflow process is performed to form the external connection terminal 260. The reflow process may be performed at a high temperature, e.g., a temperature of about 200° C. to about 280° C., for tens of seconds to a few minutes. During the reflow process, the solder ball 263 (see FIG. 13J) and the preliminary external connection terminal layer 261 (see FIG. 13J) are melted at a high temperature and solidified, and thus the external connection terminal 260 in which the solder ball 263 and the preliminary external connection terminal layer 261 are integrated may be obtained.

Since the reflow process is performed in a state in which the preliminary external connection terminal layer 261 (see FIG. 13J) is formed in advance, the external connection terminal 260 formed from the preliminary external connection terminal layer 261 may cover the side wall 2531 of the upper metal layer 253. In this case, a thickness of the external connection terminal 260 in the first direction (e.g., X-direction or Y-direction) on the side wall 2531 of the upper metal layer 253 may be equal to or greater than the thickness of the preliminary external connection terminal layer 261 (see FIG. 13J) in the first direction. For example, on the side wall 2531 of the upper metal layer 253, a minimum thickness of the external connection terminal 260 in the first direction may be 5 μm to 50 μm, or 10 μm to 30 μm.

Also, when a composition of the preliminary external connection terminal layer 261 (see FIG. 13J) is the same as that of the solder ball 263 (see FIG. 13J), the external connection terminal 260 that is uniform and has no boundary between the preliminary external connection terminal layer 261 and the solder ball 263 may be obtained. In some embodiments, when a thickness of the preliminary external connection terminal layer 261 (see FIG. 13J) is sufficiently small, the components in the preliminary external connection terminal layer are rapidly diffused into the solder ball through the reflow process, and accordingly, the external connection terminal 260 that is uniform and has no boundary between the preliminary external connection terminal layer 261 and the solder ball may be obtained.

In some embodiments, when the preliminary external connection terminal layer 261 (see FIG. 13J) includes a single metal layer, e.g., Au layer, the preliminary external connection terminal layer 261 may form an intermetallic compound (IMC) with a certain component in the upper metal layer 253 and/or the solder ball 263 (see FIG. 13J) through the reflow process. In this case, the IMC may be between the external connection terminal 260 and the external pad 250.

In some embodiments, the IMC generated by the reflow may partially or entirely embed irregularities on the external pad 250.

After that, the semiconductor package manufactured at a wafer level is cut along a scribe lane to singulate the semiconductor package into semiconductor packages 200 of individual unit as shown in FIG. 11.

In some embodiments, in the process of FIG. 13G, the formation of the preliminary external connection terminal layer 261 may be omitted. In this case, processes of FIG. 13F to FIG. 13H may be omitted. That is, the exposed portion of the lower metal layer 251m (see FIG. 13G) may be removed right after the process of FIG. 13E, without forming the second mask pattern 283 (see FIG. 13G).

According to one or more embodiments, the external connection terminal 260 may completely cover the external pad 250. In particular, when the external pad 250 is formed to have a height of 10 μm or greater (see 250h of FIG. 12), edges of the external pad 250 may be exposed even after the reflow process, and attachability to the lower metal layer 251 and the upper metal layer 253 may degrade. However, according to one or more embodiments, since the reflow process is performed after forming the preliminary external connection terminal layer 261 (see FIG. 13I) that covers the external pad 250 in advance, the external connection terminal 260 may completely cover the external pad 250 and extends to the lower portion of the upper metal layer 253 to be in contact with the lower metal layer 251. Since the external pad 250 is insulated from outside due to the external connection terminal 260, damage to the external pad 250 may be prevented.

FIGS. 15A to 15D are cross-sectional views illustrating a method of manufacturing the semiconductor package 200 of FIG. 11 according to another embodiment, in a processing order.

Some processes of the manufacturing method according to the embodiment are the same as those of FIGS. 13A to 13D in the manufacturing method illustrated above with reference to FIGS. 13A to 13K. Therefore, processes different from those of the above method will be described below.

Figure 15A:
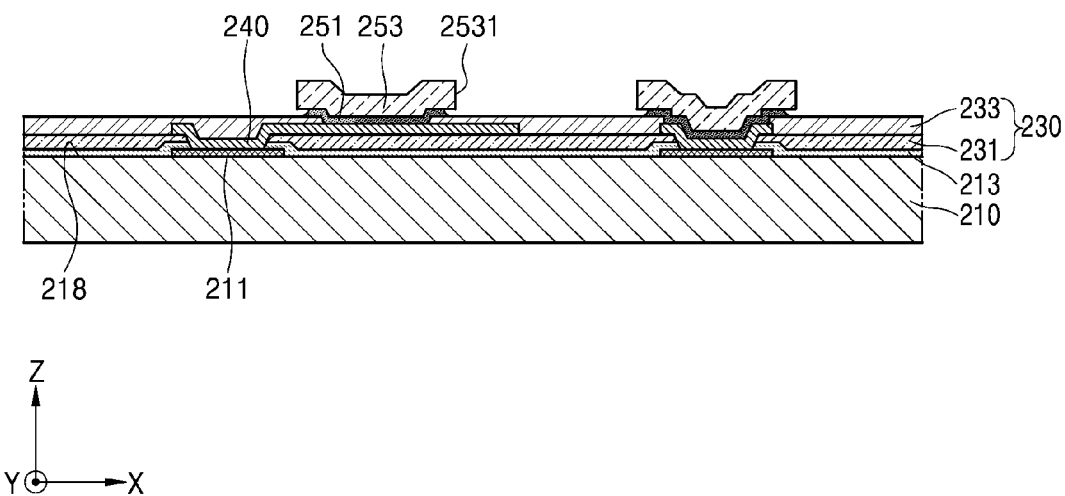
FIGS. 15A to 15D are cross-sectional views illustrating a method of manufacturing the semiconductor package of FIG. 11, according to another embodiment, in a processing order.

The process illustrated in FIG. 15A is successive to the processes illustrated in FIGS. 13A to 13D. Referring to FIG. 15A, after forming the upper metal layer 253, the first mask pattern 281 (see FIG. 13D) on the upper metal layer 251m is removed. The first mask pattern 281 (see FIG. 13D) may be removed by, for example, a strip process.

Next, the lower metal layer 251m (see FIG. 13D) that is exposed due to the removal of the first mask pattern 281 (see FIG. 13D) is partially removed. That is, the first portion of the lower metal layer 251m (see FIG. 13D), wherein the first portion is covered by the upper metal layer 253, remains and the second portion of the lower metal layer 251m (see FIG. 13D), wherein the second portion is exposed due to the removal of the first mask pattern 281 (see FIG. 13D), may be removed. For example, the second portion of the lower metal layer 251m (see FIG. 13D) may be removed by an etching process.

The second portion of the lower metal layer 251m (see FIG. 13D) may be removed by an isotropic etching. In the lower metal layer 251 (see FIG. 13D), the edge of the portion (e.g., first portion) covered by the upper metal layer 253, as well as the portion under the first mask pattern 281 (see FIG. 13D), that is, the second portion, may be also partially removed. Due to the partial removal on the edge of the first portion, the side wall of the lower metal layer 251 may have a lateral profile located inside the side wall 2531 of the upper metal layer 253. That is, the side wall 2511 (see FIG. 12) of the lower metal layer 251 may be retreated inward from the side wall 2531 of the upper metal layer 253, towards a center of the lower metal layer 251.

Figure 15B:
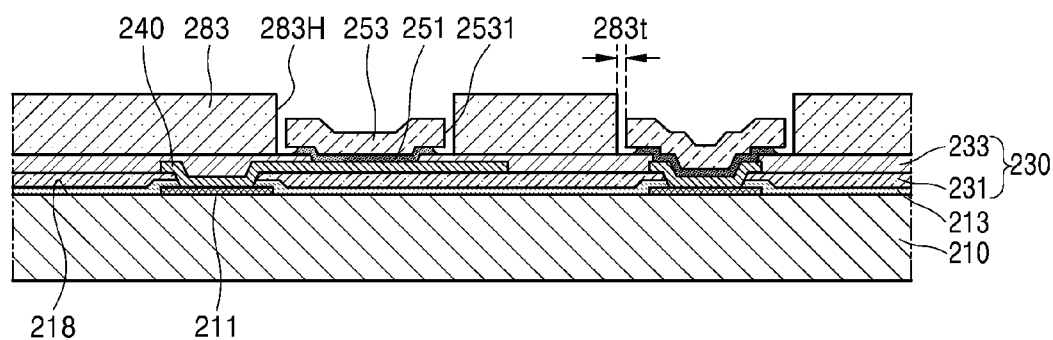

Referring to FIG. 15B, after removing the first mask pattern 281 (see FIG. 13D), the second mask pattern 283 is formed on the second insulating pattern 233. The second mask pattern 283 may include the opening 283H for exposing the upper metal layer 253. For example, the second mask pattern 283 may be formed by forming a photosensitive material layer on the second insulating pattern 233 and the upper metal layer 253 and patterning the photosensitive material layer by an exposure process and a development process performed on the photosensitive material layer.

In one or more embodiments, the opening 283H of the second mask pattern 283 may have a width that is greater than that of the upper metal layer 253. The upper surface and the side wall 2531 of the upper metal layer 253 may be exposed through the opening 283H of the second mask pattern 283, and the second insulating pattern 233 near the side wall 2531 of the upper metal layer 253 may be partially exposed.

The internal wall of the second mask pattern 283, which is formed by the opening 283H of the second mask pattern 283, may be separated a predetermined distance 283t from the side wall 2531 of the upper metal layer 253. In one or more embodiments, in the first direction (e.g., X-direction or Y-direction) that is in parallel with the first surface 218 of the semiconductor chip 210, the distance 283t between the side wall 2531 of the upper metal layer 253 and the internal wall of the second mask pattern 283 may be 5 μm to 50 μm, or 10 μm to 30 μm.

Figure 15C:
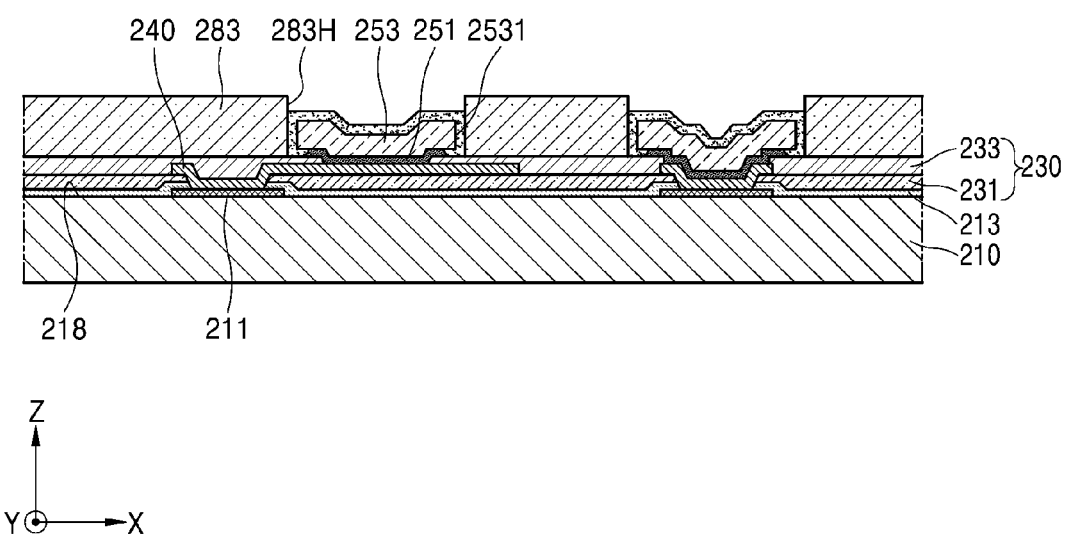

Referring to FIG. 15C, after forming the second mask pattern 283, the preliminary external connection terminal layer 261 covering the external pad 150 is formed in the opening 283H of the second mask pattern 283. For example, the preliminary external connection terminal layer 261 may cover the upper surface of the upper metal layer 253, the side wall 2531 of the upper metal layer 253, and the second insulating pattern 233 exposed between the side wall 2531 of the upper metal layer 253 and the internal wall of the second mask pattern 283. For example, the preliminary external connection terminal layer 261 may be formed by a plating process.

For example, the preliminary external connection terminal layer 261 may include Sn, Ag, In, Bi, Sb, Cu, Zn, Pb, and/or an alloy thereof. In one or more embodiments, the preliminary external connection terminal layer 261 may include a material that is the same as a material included in a solder ball 263 (see FIG. 13J) that will be placed on the preliminary external connection terminal layer 261 through a post-process.

In one or more embodiments, the preliminary external connection terminal layer 261 may fill a space between the side wall 2531 of the upper metal layer 253 and the internal wall of the second mask pattern 283. Accordingly, a thickness of the preliminary external connection terminal layer 261 that covers the side wall 2531 of the upper metal layer 253 in the first direction (e.g., X-direction or Y-direction) may correspond to the distance 283t (see FIG. 13F) between the side wall 2531 of the upper metal layer 253 and the internal wall of the second mask pattern 283. For example, the thickness of the preliminary external connection terminal layer 261 in the first direction, wherein the preliminary external connection terminal layer 261 covers the side wall 2531 of the upper metal layer 253, may be 5 μm to 50 μm, or 10 μm to 30 μm.

Figure 15D:
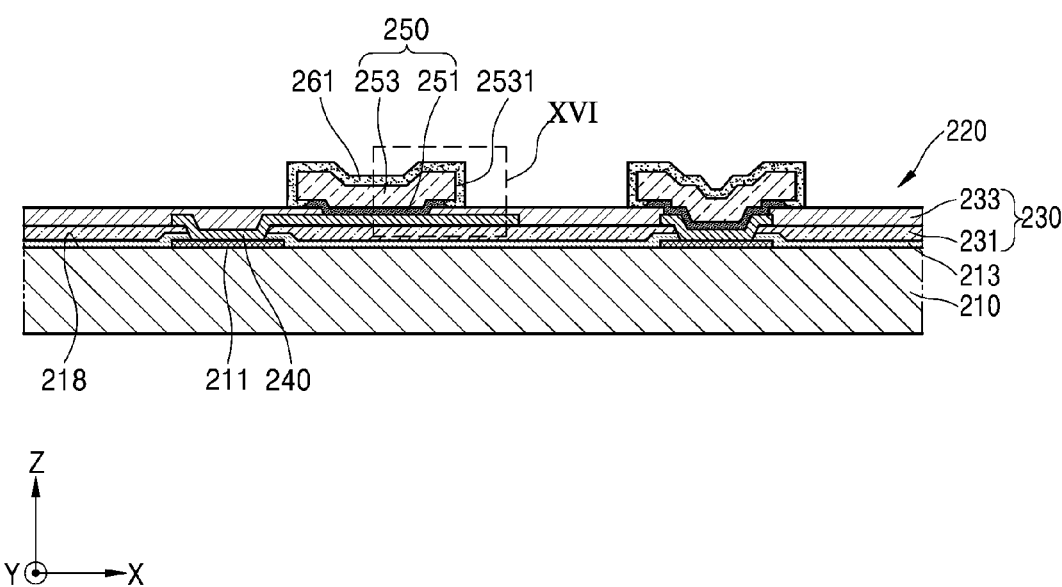

Referring to FIG. 15D, after forming the preliminary external connection terminal layer 261, the second mask pattern 283 (see FIG. 15C) is removed. The second mask pattern 283 (see FIG. 15C) may be removed by, for example, a strip process.

Figure 16:
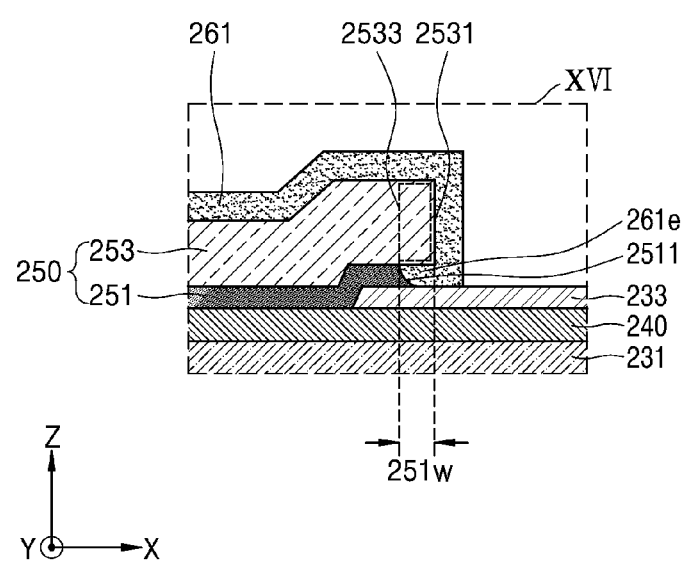
FIG. 16 is a partially enlarged view of a region XVI of FIG. 15D.

FIG. 16 is a partially enlarged view of a region XVI of FIG. 15D.

Referring to FIG. 16, the side wall 2511 of the lower metal layer 251 may have a concave surface. In detail, the side wall 2511 may have a profile that is concave towards the center of the lower metal layer 251. The shape and structure of the side wall 2511 are described in detail above with reference to FIG. 14, and descriptions thereof are omitted.

The preliminary external connection terminal layer 261 may include an extension 261e that extends towards a lower portion of the protrusion 2533. An upper portion of the extension 261e may be in contact with a lower surface of the upper metal layer 253 and a lower portion of the extension 260e may be in contact with an upper surface of the second insulating pattern 233. Moreover, the extension 261e may be at least partially in contact with the side wall 2511 of the lower metal layer 251.

After that, the semiconductor package 200 may be manufactured through the processes described above with reference to FIGS. 13J and 13K.

Figure 17:
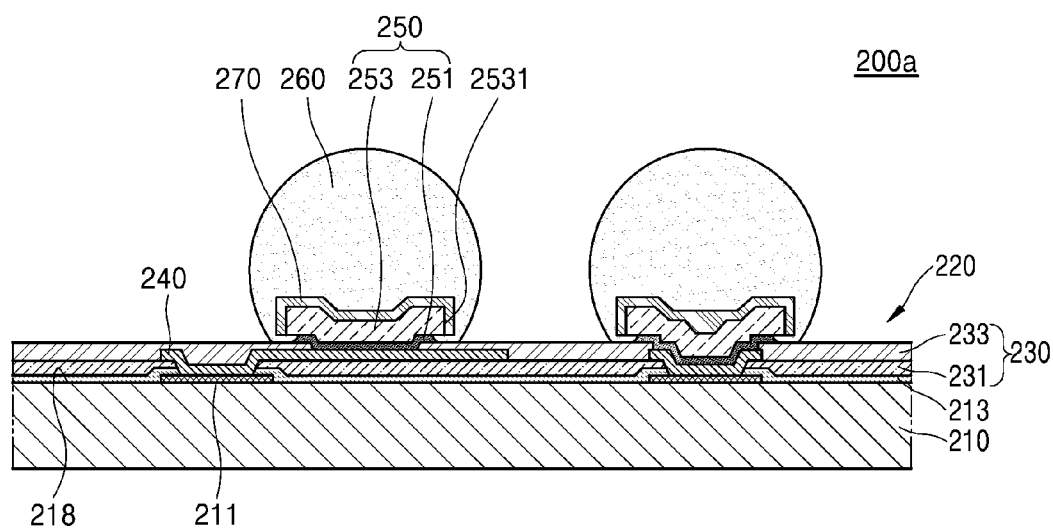
FIG. 17 is a cross-sectional view of a semiconductor package according to an embodiment.

FIG. 17 is a cross-sectional view of a semiconductor package 200a according to an embodiment. The semiconductor package 200a of FIG. 17 may have the same structure as that of the semiconductor package 200 shown in FIGS. 11 and 12, except that a diffusion barrier layer 270 is further provided. In FIG. 17, descriptions about the elements that are already described above with reference to FIGS. 11 and 12 are briefly provided or omitted.

Referring to FIG. 17, the semiconductor package 200a may include the semiconductor chip 210, and the redistribution structure 220, the external connection terminal 260, and the diffusion barrier layer 270 on the semiconductor chip 210.

The diffusion barrier layer 270 may be between the external connection terminal 260 and the external pad 250. The diffusion barrier layer 270 may cover, for example, the upper surface and the side wall 2531 of the upper metal layer 253. Also, a lower surface of the diffusion barrier layer 270 may be flush with a lower surface of the upper metal layer 253. That is, the lower surface of the diffusion barrier layer 270 may be flush with an upper surface of the lower metal layer 251.

For example, the diffusion barrier layer 270 may include Ni, Co, Cu, or a combination thereof.

In one or more embodiments, the diffusion barrier layer 270 may include a material different from that of the external connection terminal 260 and from that of the external pad 250. For example, when the upper metal layer 253 of the external pad 250 includes Cu and the external connection terminal 260 includes Sn and Ag, the diffusion barrier layer 270 may include Ni or an alloy of Ni.

The diffusion barrier layer 270 is provided between the external connection terminal 260 and the external pad 250 to prevent excessive generation of the IMC due to the reaction between the external connection terminal 260 and the external pad 250.

Moreover, the diffusion barrier layer 270 may prevent exposure of the external pad 250 to outside by covering the external pad 250 and may prevent the damage to the external pad 250 caused by the exposure of the external pad 250 to outside. Thus, the reliability of the semiconductor package 200a may be improved.

Figure 18A:
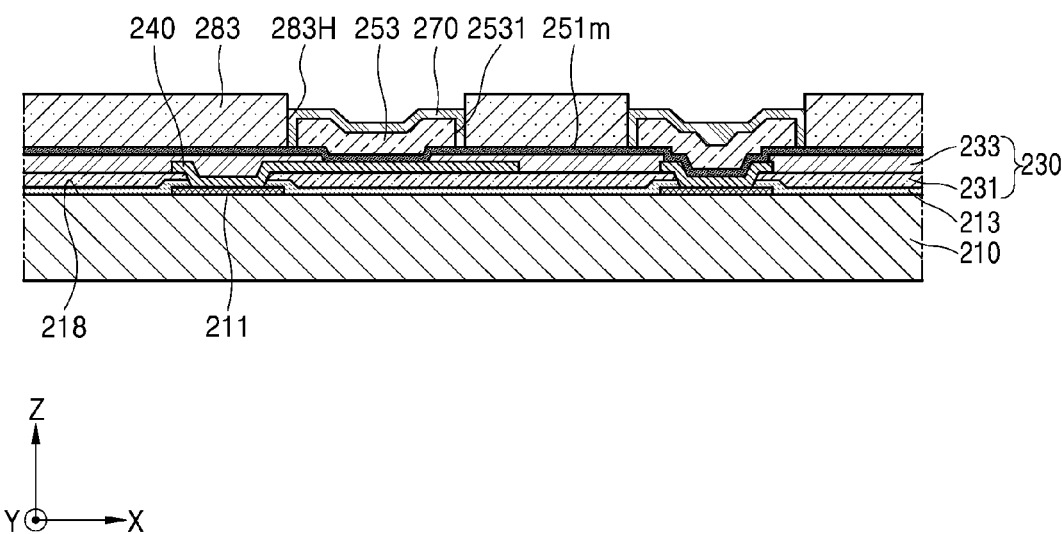
FIGS. 18A to 18C are cross-sectional views illustrating a method of manufacturing the semiconductor package of FIG. 17 according to a processing order.
Figure 18B:
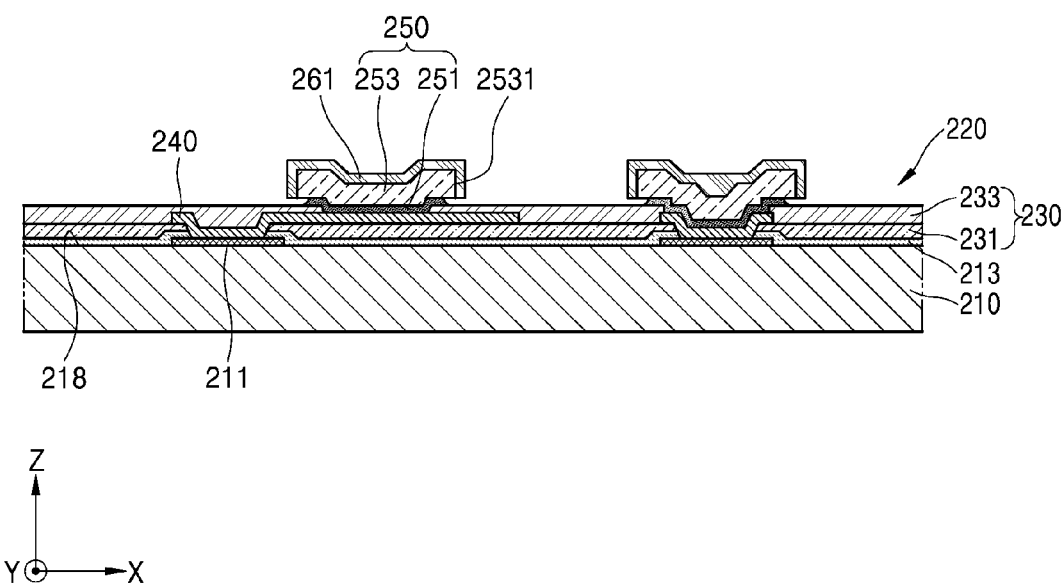
Figure 18C:
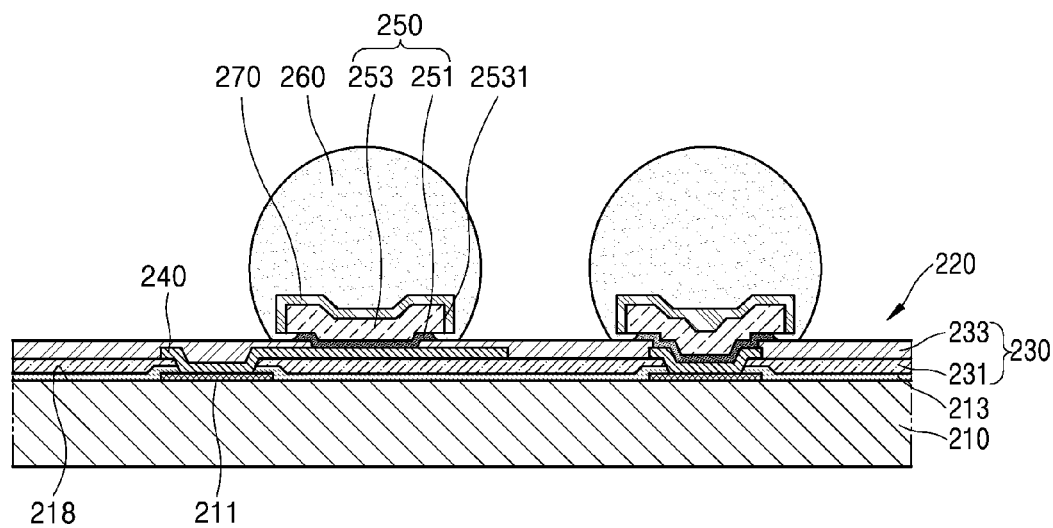

FIGS. 18A to 18C are cross-sectional views illustrating a method of manufacturing the semiconductor package 200a of FIG. 17 according to a processing order.

Referring to FIG. 18A, a structure corresponding to a resultant of the process shown in FIG. 13F is prepared, and the diffusion barrier layer 270 covering the external pad 250 is formed in the opening 283H of the second mask pattern 283. The diffusion barrier layer 270 may cover the upper surface of the upper metal layer 253, the side wall 2531 of the upper metal layer 253, and the lower metal layer 251m exposed between the side wall 2531 of the upper metal layer 253 and the internal wall of the second mask pattern 283. For example, the diffusion barrier layer 270 may be formed by a plating process.

In one or more embodiments, the diffusion barrier layer 270 may fill the space between the side wall 2531 of the upper metal layer 253 and the internal wall of the second mask pattern 283. Accordingly, a thickness of the diffusion barrier layer 270 in the first direction (e.g., X-direction or Y-direction), wherein the diffusion barrier layer 270 covers the side wall 2531 of the upper metal layer 253, may correspond to the separated distance between the side wall 2531 of the upper metal layer 253 and the internal wall of the second mask pattern 283. For example, the thickness of the diffusion barrier layer 270 covering the side wall 2531 of the upper metal layer 253 in the first direction may be 5 μm to 50 μm or 10 μm to 30 μm.

Referring to FIG. 18B, after forming the diffusion barrier layer 270, the second mask pattern 283 (see FIG. 18A) is removed. The second mask pattern 283 (see FIG. 18A) may be removed by, for example, a strip process.

After removing the second mask pattern 283 (see FIG. 18A), the lower metal layer 251m (see FIG. 18A) that is exposed due to the removal of the second mask pattern 283 is partially removed. That is, a first portion of the lower metal layer 251m (see FIG. 18A), wherein the first portion is covered by the diffusion barrier layer 270 and the upper metal layer 253, remains and a second portion of the lower metal layer 251m (see FIG. 18A), wherein the second portion is exposed due to the removal of the second mask pattern 283 (see FIG. 18A), may be removed. For example, the second portion of the lower metal layer 251m (see FIG. 18A) may be removed by an etching process.

The formation of the lower metal layer 251 is described above with reference to FIG. 13I, and detailed descriptions thereof are omitted.

Referring to FIG. 18C, the external connection terminal 260 is formed on the diffusion barrier layer 270. Similarly to the descriptions above with reference to FIGS. 13J and 13K, the flux 280 (see FIG. 13J) is applied onto the diffusion barrier layer 270, the solder ball 263 (see FIG. 13J) is placed on the diffusion barrier layer 270, on which the flux 280 is applied, and the reflow process for melting and solidifying the solder ball may be performed, in order to form the external connection terminal 260.

After that, the semiconductor package manufactured at a wafer level is cut along a scribe lane to singulate the semiconductor package into semiconductor packages 200a of individual unit as shown in FIG. 17.

According to one or more embodiments, even when the external connection terminal 260 formed through the reflow process does not cover the side wall 2531 of the upper metal layer 253 in the external pad 250, the reflow process is performed in a state in which the diffusion barrier layer 270 covering the external pad 250 is formed in advance, and thus, the external pad 250 may be completely covered by the diffusion barrier layer 270.

Figure 19:
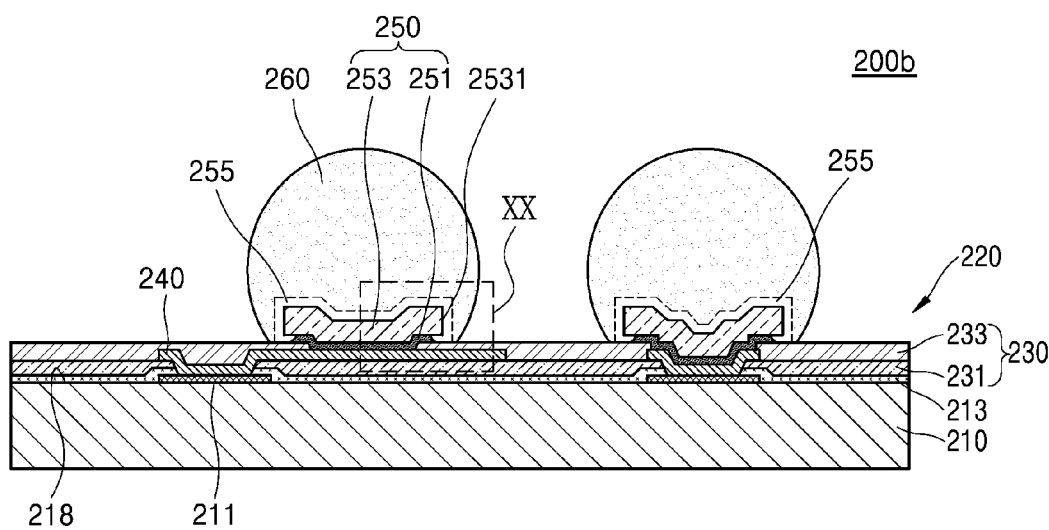
FIG. 19 is a cross-sectional view of a semiconductor package according to an embodiment.
Figure 20:
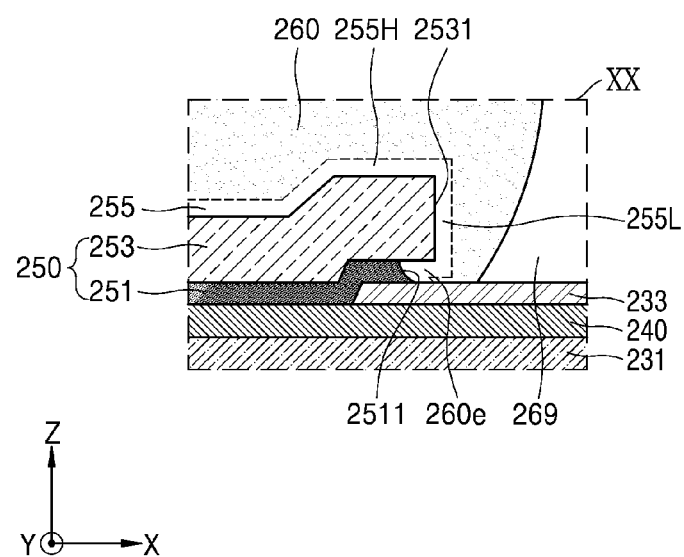
FIG. 20 is a cross-sectional view showing an enlarged view of a region XX of FIG. 19.

FIG. 19 is a cross-sectional view of a semiconductor package 200b according to an embodiment. FIG. 20 is a cross-sectional view showing an enlarged view of a region XX of FIG. 19.

Referring to FIGS. 19 and 20, the semiconductor package 200b is the same as the semiconductor package 200 described above with reference to FIGS. 11 and 12, except that an intermetallic compound area 255 is further formed between the external connection terminal 260 and the external pad 250. Therefore, the semiconductor package 200b will be described based on the above difference.

After forming the external connection terminal 260 through the reflow process as shown in FIG. 19, the intermetallic compound area 255 may be formed between the external connection terminal 260 and the external pad 250. The intermetallic compound area 255 may include an alloy in which one or more metal elements in the external pad 250 and one or more metal elements in the external connection terminal 260 form a compound in a predetermined stoichiometric ratio.

In some embodiments, a composition of the IMC included in the intermetallic compound area 255 may vary depending on a location thereof. Referring to FIG. 20, the intermetallic compound area 255 includes a first intermetallic compound area 255L that is adjacent to the lower metal layer 251, and a second intermetallic compound area 255H away from the lower metal layer 251.

In some embodiments, the first intermetallic compound area 255L may have a relatively higher concentration of the intermetallic compound including the metal element of the lower metal layer 251, as compared with the second intermetallic compound area 255H. In some embodiments, in the intermetallic compound in the first intermetallic compound area 255L, a concentration of the metal element included in the lower metal layer 251 may be less than that of the metal element included in the external connection terminal 260. In some embodiments, in the intermetallic compound in the second intermetallic compound area 255H, a concentration of the metal element included in the lower metal layer 251 may be less than that of the metal element included in the upper metal layer 253 and the external connection terminal 260.

The intermetallic compound area 255 may be formed by, for example, the reflow process as shown in FIG. 13K. That is, the solder ball 263 is placed on the preliminary external connection terminal layer 261 on which the flux 280 is applied as shown in FIG. 13J, and then the reflow process is performed as shown in FIG. 13K. Then, the intermetallic compound area 255 may be generated between the external connection terminal 260 and the external pad 250.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A semiconductor package comprising:
    a semiconductor chip comprising a chip pad on a first surface thereof;
    an insulating layer on the first surface of the semiconductor chip;

an external pad electrically connected to the chip pad of the semiconductor chip;

an external connection terminal covering the external pad; and an intermediate layer between the external pad and the external connection terminal, the intermediate layer comprising a third metal material that is different from a first metal material included in the external pad and a second metal material included in the external connection terminal, wherein the external connection terminal covers a side wall of the external pad and is in surface contact with an upper surface of the insulating layer, and wherein, with respect to a vertical direction that is perpendicular to the first surface of the semiconductor chip, a height of the external pad in the vertical direction measured from the upper surface of the insulating layer is about 10 μm to about 50 μm.

2. The semiconductor package of claim 1, wherein the third metal material in the intermediate layer comprises at least one of aurum (Au), palladium (Pd), nickel (Ni), and copper (Cu).

3. The semiconductor package of claim 1, wherein with respect to a first direction that is in parallel with the first surface of the semiconductor chip, a thickness of the external connection terminal in the first direction, between an uppermost end of the side wall of the external pad and an external surface of the external connection terminal, is about 10 μm to about 30 μm.

4. The semiconductor package of claim 1, further comprising a wiring pattern extending between the chip pad of the semiconductor chip and the external pad, the wiring pattern electrically connecting the chip pad to the external pad.

5. The semiconductor package of claim 1, wherein the semiconductor package is a fan-out type semiconductor package.

6. A semiconductor package comprising:
 a semiconductor chip comprising a chip pad on a first surface thereof;
 an insulating layer on the first surface of the semiconductor chip;
 an external pad electrically connected to the chip pad of the semiconductor chip; and
 an external connection terminal covering the external pad, the external connection terminal comprising a solder, wherein the external connection terminal further comprises a second metal material that is different from the solder and a first metal material included in the external pad,
 wherein the external connection terminal covers a side wall of the external pad and is in surface contact with an upper surface of the insulating layer, and
 wherein, with respect to a vertical direction that is perpendicular to the first surface of the semiconductor chip, a height of the external pad in the vertical direction measured from the upper surface of the insulating layer is about 10 μm to about 50 μm.

7. The semiconductor package of claim 6, wherein the second metal material is about 0.00001 wt % to about 1 wt % of a total weight of the external connection terminal.

8. The semiconductor package of claim 6, wherein the second metal material comprises at least one of aurum (Au), palladium (Pd), and nickel (Ni), and copper (Cu).

9. The semiconductor package of claim 6, with respect to a first direction that is in parallel with the first surface of the semiconductor chip, a thickness of the external connection terminal in the first direction, between an uppermost end of the side wall of the external pad and an external surface of the external connection terminal, is about 10 μm to about 30 μm.

10. A semiconductor package comprising:
 a substrate comprising a conductive pad on a first surface thereof;
 an insulating pattern on the first surface, the insulating pattern at least partially exposing the conductive pad;
 an external pad including a lower metal layer connected to the conductive pad an upper metal layer on the lower metal layer; and
 an external connection terminal covering entire upper surface and entire side wall surface of the upper metal layer,
 wherein a lateral profile of the lower metal layer is located inside the side wall surface of the upper metal layer,
 wherein the external connection terminal contacts to an upper surface of the insulating pattern, and
 wherein, with respect to a vertical direction that is perpendicular to the first surface of the substrate, a height of the external pad in the vertical direction measured from the upper surface of the insulating pattern is about 10 μm to about 50 μm.

11. The semiconductor package of claim 10, wherein the lateral profile of the lower metal layer comprises a concave curve, the upper metal layer comprises a protrusion protruding in a lateral direction from the lower metal layer, and the external connection terminal comprises an extension that extends towards a lower portion of the protrusion of the upper metal layer.

12. The semiconductor package of claim 11, wherein the external connection terminal is in contact with a lower surface of the upper metal layer.

13. The semiconductor package of claim 12, wherein the extension is in contact with the side surface of the lower metal layer.

14. The semiconductor package of claim 10, further comprising an intermetallic compound between the external connection terminal and the upper metal layer.

15. The semiconductor package of claim 10, wherein the external connection terminal is in contact with the side wall surface of the upper metal layer and an upper surface of the insulating pattern near the side wall surface.

16. The semiconductor package of claim 10, wherein the substrate comprises a semiconductor substrate, and the conductive pad comprises a chip pad electrically connected to the semiconductor substrate.

17. The semiconductor package of claim 10, wherein the lower metal layer is electrically connected to the conductive pad via a wiring pattern, the wiring pattern has a thickness of about 3 μm to about 8 μm, and a ratio of a sum (T2) of thicknesses of the upper metal layer and the lower metal layer with respect to the thickness (T1) of the wiring pattern, that is, T2/T1, is about 1.25 to about 40.

* * * * *